US012199633B2

United States Patent
Van Oven et al.

(10) Patent No.: US 12,199,633 B2
(45) Date of Patent: Jan. 14, 2025

(54) DYNAMIC CONTROL FOR A QUANTUM COMPUTER

(71) Applicant: QBLOX B.V., Delft (NL)

(72) Inventors: Jules Christiaan Van Oven, Delft (NL); Cornelis Christiaan Bultink, Delft (NL); Jordy Marinus Josephus Gloudemans, Delft (NL)

(73) Assignee: QBLOX B.V., Delft (NL)

( * ) Notice: Subject to any disclaimer, the term of this patent is extended or adjusted under 35 U.S.C. 154(b) by 0 days.

(21) Appl. No.: 17/998,017

(22) PCT Filed: May 10, 2021

(86) PCT No.: PCT/NL2021/050303
§ 371 (c)(1),
(2) Date: Nov. 4, 2022

(87) PCT Pub. No.: WO2021/225447
PCT Pub. Date: Nov. 11, 2021

(65) Prior Publication Data
US 2023/0170916 A1 Jun. 1, 2023

(30) Foreign Application Priority Data

May 8, 2020 (NL) ..................................... 2025542
Aug. 11, 2020 (NL) ..................................... 2026255

(51) Int. Cl.
*G06F 9/44* (2018.01)
*G06F 9/445* (2018.01)
(Continued)

(52) U.S. Cl.
CPC ........ *H03M 1/661* (2013.01); *G06F 9/44521* (2013.01); *G06N 10/40* (2022.01); *H03M 1/662* (2013.01)

(58) Field of Classification Search
CPC ...... H03M 1/661; H03M 1/662; G06N 10/40; G06F 9/44521
See application file for complete search history.

(56) References Cited

U.S. PATENT DOCUMENTS 11,526,797 B2 * 12/2022 Verdon-Akzam ....... H03M 1/66
11,677,738 B1 * 6/2023 Stapleton ............... G06N 10/00
713/164

(Continued)

FOREIGN PATENT DOCUMENTS

WO 2017139683 A1 8/2017

OTHER PUBLICATIONS

International Search Report and Written Opinion for corresponding International application No. PCT/NL2021/050303; dated Jul. 26, 2021 (16 pages).

(Continued)

*Primary Examiner* — Zahid Choudhury
(74) *Attorney, Agent, or Firm* — Mendelsohn Dunleavy, PC

(57) ABSTRACT

Methods and apparatus for dynamically controlling a quantum computer are described wherein the method includes selecting a first and second digital pulse signal stored in a memory, the first digital pulse signal having a first pulse shape and a first sample rate and the second digital pulse signal having a second pulse shape and a second sample rate, at least the first or the second sample rate being lower than an output sampling rate of a digital-to-analog converter (DAC); forming a digital pulse sequence signal, the forming including applying a first interpolation algorithm to determine a first upsampled digital pulse signal based on the first digital signal and a second interpolation algorithm to determine a second upsampled digital pulse signal based on the second digital signal, the sample rates of the first and second upsampled digital signals matching the sample rate of the (Continued)

DAC; and, providing the digital pulse sequence signal comprising the first and second upsampled digital pulse signals to an input of the DAC to transform the first and second upsampled digital signals into an analog pulse sequence signal for controlling the quantum device.

16 Claims, 15 Drawing Sheets

(51) Int. Cl.
*G06N 10/40* (2022.01)
*H03M 1/66* (2006.01)

(56) References Cited

U.S. PATENT DOCUMENTS

| | | | | |
|---|---|---|---|---|
| 2017/0076787 | A1* | 3/2017 | Frank | G06N 10/00 |
| 2017/0286858 | A1* | 10/2017 | La Cour | G06F 7/523 |
| 2019/0049495 | A1* | 2/2019 | Ofek | G06F 9/5027 |
| 2022/0335325 | A1* | 10/2022 | Dallaire-Demers | G06N 10/20 |
| 2023/0409949 | A1* | 12/2023 | Utsugi | G06N 10/00 |

OTHER PUBLICATIONS

International Preliminary Report and Patentability for corresponding International application No. PCT/NL2021/050303; dated Sep. 6, 2022 (29 pages).

Bultink, Cornelis Christiaan, et al. "General method for extracting the quantum efficiency of dispersive qubit readout in circuit QED." Applied Physics Letters 112.9, Article 092601 (2018): 1-5.

Liu, Yehan. "Quantum Feedback Control of Multiple Superconducting Qubits." Dissertation. Yale University (2016): 1-165.

Ryan, Colm A., et al. "Hardware for dynamic quantum computing." Review of Scientific Instruments 88.10 Article 104703 (2017): 1-13.

Watson, T. F., et al. "A programmable two-qubit quantum processor in silicon." Nature 555.7698 (2018): 633-637.

Tektronix, "Overcoming RF Signal Generation Challenges in Qunatum Computing with New DAC Technologies." White Paper, Retrieved from Internet: <URL: https://download.tek.com/document/76W_60983_0_Quantum_WP.pdf> (2017): 12 pages.

Tektronix, "AWG5200 Series Arbitrary Waveform Generators Specifications and Performance Verification—Technical Reference." Retrieved from Internet: <URL: https://download.tek.com/manual/AWG5200-Series-Specifications-and-Performance-Verification-077133500-RevA.pdf> (2018): 94 pages.

Tektronix, "Applications for SourceXpress and AWG70000/5200 Series generators—RF Generic Signal Datasheet." Datasheet. Retrieved from Internet: <URL: https://download.tek.com/datasheet/RF-Generic-Signal-Datasheet-76W606212.pdf> (2019): 4 pages.

Tektronix, "Using the Sequencer on Tektronix AWG70000B series instruments." Application Note. Retrieved from Internet: <URL: https://download.tek.com/document/Sequencer%20on%20AWG70000B_App-Note_76W-30715-1_021.pdf> (2019): 14 pages.

Wikipedia Contributors, "Cascaded integrator-comb filter." Wikipedia, The Free Encyclopedia, Retrieved from Internet: <URL: https://en.wikipedia.org/w/index.php?title=Cascaded_integrator%E2%80%93comb_filter&oldid=866178494> (2018): 4 pages.

* cited by examiner

DYNAMIC CONTROL FOR A QUANTUM COMPUTER

FIELD OF THE INVENTION

The invention relates to dynamically controlling a quantum computer, and, in particular, though not exclusively, to methods and systems for dynamically controlling a quantum computer, a dynamic controller for a quantum computer and a computer program product for executing such methods.

BACKGROUND OF THE INVENTION

Quantum experiments require a classical control system to control and readout the quantum circuit. This control system is in its core a digital system but requires digital-to-analog (DAC) conversion to create control pulses and analog-to-digital (ADC) conversion to readout back the quantum bit state information. The control pulse-shapes are stored in digital memory connected to a Digital to Analog Converter (DAC) capable of converting the digital pulse shape into an analog pulse. To handle the stringent speed and accuracy requirements, the control system is typically implemented using a digital circuit such as a programmable gate array (FPGAs) or a complex programmable logic device (CPLD) that connects the DAC to an on-board Block RAM memory or an external SDRAM memory chip.

Most pulses are very short (tens of nanoseconds), have high-frequency content and therefore require high-speed DACs, e.g. 1 Giga samples per second (GSPS), to generate them. Often however, these short pulses need to be interleaved with much slower pulses (in the millisecond range). For example, Watson et al, described in their article *A programmable two-qubit quantum device in silicon*, Nature 555, p. 633-637 (2018) an example of controlling a programmable two spin-qubit processor. Electronics coupled to the qubits include programmable arbitrary waveguide generators (AWGs) that can generate pulse sequences for initializing and manipulating qubits to perform certain operations and read-out electronics to measure the result of the operations. The control signals include both long pulses in the order of (tens of) milliseconds for initialization and read-out while the actual algorithm, the manipulation of the qubits, only includes pulses that are typically 10-100 nanoseconds.

Although the operations represented a very simple algorithm for only two qubits, the electronics needed to generate the pulse sequences and to readout the response of the qubits in response to the operations are very complex, non-scalable and inflexible. The pulse sequences are constructed in advance and stored as a whole in a relatively large memory. The disadvantage of such approach is that it only allows repetitive execution of the same sequences. Execution of operations that are for example conditional to the state of the quantum device so that the controller can dynamically adjust a pulse sequence is not possible as it requires a fast response of the control electronics to the readout of the quantum device.

Colm et al described in their article *Hardware for dynamic quantum computing*, Review of Scientific Instruments 88, 104703 (2017) a pulse sequence generator for dynamic control of superconducting qubits that is capable of generating a sequence of short pulses on the fly. To enable dynamic construction of an arbitrary pulse sequence, the generator has access to a large number of digital pulse signals of different shapes that are stored in an SDRAM memory that is external to the FPGA. During execution, a digital pulse signal is loaded from the SDRAM to a fast-onboard FPGA block RAM that serves as a cache before the digital pulse signal is fed to a high-speed DAC to generate a desired signal shape. A caching strategy is used to prefetch a set of digital pulse shapes from the SDRAM and store it in the cache, while another set of digital pulse shapes in the cache is fed to the DAC.

This system is not suitable for dynamically generating pulse sequences that both include long and short pulses. A high-speed DAC requires a lot of memory to store the pulse-shape. For example, a 100 ms pulse generated in 16-bit resolution at 1 GSPS requires 200 MB of digital memory to store it. Such memory requirements are a challenge as fast onboard FPGA block RAM, is typically limited to a few megabytes, while SDRAM memory has some severe limitations. For example, SDRAM and similar memory chips have very long random-access times, e.g. in the order of hundredths of nanoseconds, which seriously limits or even disables dynamic pulse selection that is needed when executing an algorithm that requires feedback. The caching strategy presented in Colm et al increases the library of pulses that can be at hand in a dynamic sequencing at the cost of increasing the overall complexity of the system. However, it does not allow individual pulses to be longer than what fits in the limited onboard FPGA block RAM. Furthermore, the handling of large data files can be inconvenient to the operator of the instruments due to the longer loading times involved.

Hence, from the above it follows there is a need in the art for improved dynamic control of a quantum device. In particular, there is a need in the art for improved, e.g. simple, flexible and scalable, methods and systems for dynamically generating pulse sequences including both long and short pulse shapes for operating a quantum device.

SUMMARY OF THE INVENTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by a microprocessor of a computer. Furthermore, aspects of the present invention may take the form of a computer program product embodied in one or more computer readable medium(s) having computer readable program code embodied, e.g., stored, thereon.

The methods, systems, modules, functions and/or algorithms described with reference to the embodiments in this application may be realized in hardware, software, or a combination of hardware and software. The methods, systems, modules, functions and/or algorithms may be realized in a centralized fashion in at least one computing system, or in a distributed fashion where different elements are spread across several interconnected computing systems. Any kind of computing system or other apparatus adapted for carrying out the embodiments (or parts thereof) described in this application is suited. A typical implementation may comprise one or more digital circuits such as application specific integrated circuits (ASICs), one or more field programmable gate arrays (FPGAs), and/or one or more processors (e.g., x86, x64, ARM, PIC, and/or any other suitable processor architecture) and associated supporting circuitry (e.g., storage, DRAM, FLASH, bus interface circuits, etc.). Each discrete ASIC, FPGA, processor, or other circuit may be referred to as "chip," and multiple such circuits may be referred to as a "chipset." In an implementation, the programmable logic devices may be provided with fast RAM, in particular block RAM (BRAM). Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure.

The flowcharts and block diagrams in the figures may represent architecture, functionality, and operation of possible implementations of the methods, systems and/or modules to various embodiments of the present invention. In this regard, each block in a flowchart or a block diagrams may represent a module, segment, or portion of code, which be implemented as software, hardware or a combination of software and hardware.

It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The main insight of the embodiments in this disclosure revolves around dynamic control of the sampling rate during the formation of a digital pulse sequence for a quantum device and during the analysis of signals originating from the quantum device. Pulse sequences may be generated based on stored digital pulse signals which may be associated with different sampling rates. Here, a digital pulse signal associated with a sample rate means that the pulse can be played at this sample rate.

The embodiments allow efficient storage of a plurality of digital pulse signals with different pulse shapes in a memory, such as a fast, onboard block RAM of an FPGA. These stored digital pulse signals may be processed based on a sampling rate which is substantially lower than the sampling rate of a DAC, which transforms the digital signal into an analog signal for operating a quantum computer. Storage of a large number of digital pulse signals in the fast RAM allows fast formation of the digital pulse sequences of different pulse periods. This makes the embodiments especially suitable for quantum device control in which low-latency feedback control is important. Further, the embodiments allow dynamic formation of an arbitrary pulse sequence signal that comprises both relatively short pulses (ns) and relatively long pulses (ms).

In a first aspect, the invention may relate to a method of generating a signal for controlling a quantum device, wherein the method may include: selecting a first and second digital pulse signal from a plurality of digital pulse signals stored in one or more memory modules; generating a digital pulse sequence signal, wherein the generation of the digital pulse sequence includes: retrieving first data representing the first digital pulse signal at a first sample rate from the one or more memory modules, upsampling the first digital pulse signal and providing data representing a first upsampled digital pulse signal to a digital-to-analogue converter (DAC) at a sampling rate of the DAC; retrieving second data representing the second digital pulse signal at a second sample rate from the one or more memory modules, upsampling the second digital pulse signal and providing data representing the second upsampled digital pulse signal to the DAC at the sampling of the DAC; converting the digital pulse sequence signal, by the DAC, into an analog pulse sequence signal, the sequence of pulses of the analog pulse sequence signal representing one or more operations on quantum elements of the quantum device.

Hence, the invention allows dynamic and efficient generation of a pulse sequence signal of arbitrary length and shape based on upsampling different digital pulse signals and different upsampling rates. In particular, a processor-controlled upsampling module may upsample different digital pulse signals which are stored as relatively small data sets in fast memory modules, such as block RAM modules. This way, a pulse sequence signal for controlling a quantum computer may be generated that both includes short pulse signals in the nanosecond range (e.g. 10-100 ns) and longer pulse signals in the microsecond or even millisecond range (e.g. 10-1000 microseconds). The process of generating such pulse sequence makes efficient use of memory resources of a programmable logic device, such as onboard block RAM (BRAM) which have access times of only a few nanoseconds. Because pulse sequences with pulses of different shape, amplitude and modulation can be generated on the fly without delay, quantum algorithms may be executed that require more sophisticated control such as conditional logic or the like.

In a further embodiment, the method may further include the step of providing the analog pulse sequence signal to the quantum device.

In an embodiment, the generation of the pulse sequence signal may further include: applying a first interpolation filter to the first upsampled digital pulse signal; and/or, applying a second interpolation filter to the second upsampled digital pulse signal.

In an embodiment, the generation of the digital pulse sequence signals may further include: providing upsampling information for upsampling the first and second digital pulse signal, preferably the upsampling information including information about a first upsampling rate R1 for upsampling the first digital pulse signal and a second upsampling rate R2 for upsampling the second digital pulse signal.

In an embodiment, upsampling information for upsampling the first and second digital pulse signal may be stored in the one or more memory modules.

In an embodiment, the generation of the digital pulse sequence signal may further include: retrieving the upsampling information from the one or more memory modules.

In an embodiment, the selection of the first and second digital pulse signal may be performed by a sequence processor.

In an embodiment, the generation of the digital pulse sequence signal may be performed by a pulse sequence generator, which may be controlled by the sequence processor.

In an embodiment, the digital sequence generator may comprise an upsampling module to read and upsample the first and second digital pulse signal into a first and second upsampled digital pulse signal respectively.

In an embodiment, the selection of the first and second digital pulse signal may be performed by a first and second sequence processor respectively.

In an embodiment, the generation of the digital pulse sequence signal may be performed by a first and second pulse sequence generator controlled by the first and second sequence processor respectively.

In an embodiment, first digital sequence generator may comprise a first upsampling module to read and upsample the first digital pulse signal into a first upsampled digital pulse signal.

In an embodiment, the second digital sequence generator may comprise a second upsampling module to read and upsample the second digital pulse signal into a second upsampled digital pulse signal.

In an embodiment, the method may further comprise: modulating the first upsampled digital pulse signal using a first modulation frequency and the second upsampled digital pulse signal using a second modulation frequency.

In an embodiment, the method may further comprise: summing the first and second digital pulse signal into the digital pulse sequence signal.

In an embodiment, the first sequence processor may be configured to provide the first upsampling module with upsampling information for upsampling the first digital pulse signal; and/or, the second sequence processor is configured to provide the second upsampling module with upsampling information for upsampling the second digital pulse signal.

In a further aspect, the invention may relate to a system for generating a signal for a quantum device, wherein the system may include: one or more memory modules comprising stored data representing a plurality of digital pulse signals; a sequence processor; a pulse sequence generator controlled by the sequence processor adapted to generate a digital pulse sequence signal; and, a digital-to-analogue converter (DAC) associated with a DAC sampling rate for converting the digital pulse sequence signal into an analog pulse signal, the sequence of pulses of the analog pulse sequence signal representing one or more operations on quantum elements of the quantum device. In an embodiment, the sequence processor may be adapted to select a first and second digital pulse signal from the plurality of digital pulse signals stored in the one or more memory modules. In a further embodiment, the pulse sequence generator may be adapted to generate a digital pulse sequence using an upsampling module, wherein the upsampling module is configured to: retrieve first data representing the first digital pulse signal at a first sample rate from the one or more memory modules, upsample the first digital pulse signal and provide data representing a first upsampled digital pulse signal at the DAC sampling rate to the DAC; retrieve second data representing the second digital pulse signal at a second sample rate from the one or more memory modules, upsample the second digital pulse signal and provide data representing a second upsampled digital pulse signal at the DAC sampling rate to the DAC.

Hence, the system may include a sequence processor or a system of sequence processors to execute a sequence of instructions of a software program. The sequence processor may be connected to a pulse sequence generator that includes digital pulse signals stored in a fast memory and an upsampling module. The pulse sequence generator may generate a digital pulse sequence signal for a digital-to-analog converter (DAC). Typically, at least part of the pulse sequence generator may be implemented as a programmable logic device, such as an FPGA including fast onboard block RAM. The sequence processor may use the pulse sequence generator to translate the sequence of instructions into sequences of pulses of particular shapes and durations to physical control parts, e.g. quantum bits and/or resonators, of or associated with the quantum device.

In an embodiment, the upsampling module may be further configured to: apply a first interpolation filter to the first upsampled digital pulse signal; and/or, apply a second interpolation filter to the second upsampled digital pulse signal.

In an embodiment, the sequence processor may be further configured to: provide upsampling information for upsampling the first and second digital pulse signal to the upsampling module, preferably the upsampling information including information about a first upsampling rate R1 for upsampling the first digital pulse signal and a second upsampling rate R2 for upsampling the second digital pulse signal.

In an embodiment, the upsampling information for upsampling the first and second digital pulse signal may be stored in the one or more memory modules and wherein the upsampling module may be further configured to: retrieve the upsampling information from the one or more memory modules.

In an embodiment, the sequence processor, the one or more memory modules, the pulse sequence generator, and, optionally, the DAC, may be implemented as one or more digital circuits such as one or more application specific integrated circuits (ASICs), one or more field programmable gate arrays (FPGAs), and/or one or more processors.

In another aspect, the invention relates to a system for generating a signal for a quantum device wherein the system may include: one or more memory modules comprising stored data representing a plurality of digital pulse signals; at least a first and second sequence processor; at least a first and second pulse sequence generator controlled by the first and second sequence processor respectively; a summer configured to generate a digital pulse sequence signal based on digital pulse signals generated by the first and second pulse sequence generator; and, a digital-to-analog converter (DAC) associated with a DAC sampling rate for converting the digital pulse sequence signal into an analog pulse sequence signal, the sequence of pulses of the analog pulse sequence signal representing one or more operations on quantum elements of the quantum device; the first sequence processor being adapted to select a first digital pulse signal from the plurality of digital pulse signals stored in the one or more memory modules; the second sequence processor being adapted to select a second digital pulse signal from the plurality of digital pulse signals stored in the one or more memory modules; the first pulse sequence generator comprising a first upsampling module configured to retrieve first data representing the first digital pulse signal at a first sample rate from the one or more memory modules, upsample the first digital pulse signal and provide data representing a first upsampled digital pulse signal at the DAC sampling rate to the DAC; the second pulse sequence generator comprising an upsampling module configured to retrieve second data representing the second digital pulse signal at a second sample rate from the one or more memory modules, upsample the second digital pulse signal and provide data representing a second upsampled digital pulse signal at the DAC sampling rate to the DAC.

In an embodiment, the system may comprise: at least one signal modulator for modulating the first upsampled digital pulse signal using a first modulation frequency and the second upsampled digital pulse signal using a second modulation frequency, preferably the first and second modulation frequency being generated by one or more computer-controlled oscillators, more preferably one or more numerically controlled oscillators (NCOs);

In an embodiment, the first upsampling module may be further configured to apply a first interpolation filter to the first upsampled digital pulse signal; and/or, wherein the second upsampling module may be further configured to apply a second interpolation filter to the second upsampled digital pulse signal.

In an embodiment, the first sequence processor may be further configured to provide upsampling information to the first upsampling module for upsampling the first digital pulse signal. In an embodiment, the upsampling information may include information about a first upsampling rate R1 for upsampling the first digital pulse signal.

In an embodiment, the second sequence processor may be further configured to provide upsampling information to the second upsampling module for upsampling the second digital pulse signal. In an embodiment, the upsampling information may include information about a second upsampling rate R2 for upsampling the second digital pulse signal.

In an embodiment, the upsampling information for upsampling the first and second digital pulse signal may be stored in the one or more memory modules and wherein the first and second sequence processor may be further configured to retrieve at least part of the upsampling information from the one or more memory modules.

In an embodiment, the first and second sequence processor, the one or more memory modules, the first and second pulse sequence generator, the summer, and, optionally, the DAC, may be implemented as one or more digital circuits such as one or more application specific integrated circuits (ASICs), one or more field programmable gate arrays (FPGAs), and/or one or more processors.

In a first aspect, the invention may relate to a method of controlling a quantum device wherein the method may include: a processor selecting a first and second digital pulse signal stored in a memory, the first digital pulse signal having a first pulse shape and being associated with a first sample rate and the second digital pulse signal having a second pulse shape and being associated with a second sample rate, at least one of the first or second sample rate being lower than a sampling rate of a digital-to-analog converter (DAC); the processor forming a digital pulse sequence signal, the forming including applying a first interpolation filter algorithm to determine a first upsampled digital pulse signal based on the first digital signal and a second interpolation filter to determine a second upsampled digital pulse signal based on the second digital signal, the sample rates of the first and second upsampled digital signals matching the sample rate of the DAC; and, the processor providing the digital pulse sequence signal comprising the first and second upsampled digital pulse signals to an input of the DAC to transform the first and second upsampled digital signals into analog pulse sequence signal for controlling the quantum device.

In an embodiment, the forming of a digital pulse sequence signal may include: providing first upsampling rate information, preferably a first upsampling rate factor, to an interpolation filter module to configure the interpolation filter module as the first interpolation filter; and, after the applying of the first interpolation filter algorithm, providing second upsampling rate information, preferably a second upsampling rate factor, to the interpolation filter module to configure the interpolation filter module as the second interpolation filter.

In this embodiment, a pulse sequence signal may be generated by sequentially processing different digitally stored digital pulse signals on the basis of interpolation filters with different sampling rates. This provides a very simple architecture for dynamic generation of such pulse sequences that is particular efficient in memory storage.

In another embodiment, the forming of a digital pulse sequence signal may include: a first sub-processor of the processer applying the first interpolation filter algorithm for determining the first upsampled digital pulse signal, the first interpolation filter algorithm being associated with a first upsampling rate factor; a second sub-processor of the processer applying the second interpolation filter algorithm for determining the second upsampled digital pulse signal, the second interpolation filter algorithm being associated with a second upsampling rate factor; combining the first and second first upsampled digital pulse signal into the digital pulse sequence signal.

In a further aspect, the invention relates to a method of processing a readout signal of a quantum device including: converting an analog readout signal of a quantum computer by an analog-to-digital converter (ADC) into a digital readout signal, the digital readout signal including modulated readout signals, the modulated readout signals comprising a first modulated readout signal modulated at a first frequency and a second modulated readout signal modulated at a second frequency that is different from the first frequency; demodulating the first modulated readout signal into a first demodulated readout signal and downsampling the first demodulated readout signal to a first downsampled demodulated readout signal based on a first downsampling rate factor; demodulating the second modulated readout signal into a second demodulated readout signal and downsampling the second demodulated readout signal to a second downsampled demodulated readout signal based on a second downsampling rate factor, which is different from the first downsampling rate factor; providing the first downsampled demodulated readout signal to a first analysis module to determine a first quantum state of the quantum device represented by the first downsampled demodulated readout signal; and, providing the second downsampled demodulated readout signal to a second analysis module to determine a second quantum state represented by the second downsampled demodulated readout signal.

In another aspect, the invention may relate to a dynamic controller for a quantum device comprising: a computer readable storage medium having at least part of a program embodied therewith; and, a computer readable storage medium having computer readable program code embodied therewith, and a processor, preferably a microprocessor, coupled to the computer readable storage medium, wherein responsive to executing the computer readable program code, the processor is configured to perform executable operations comprising: selecting a first and second digital pulse signal stored in a memory, the first digital pulse signal having a first pulse shape and a first sample rate and the second digital pulse signal having a second pulse shape and a second sample rate, at least one of the first or second sample rate being lower than an output sampling rate of a digital-to-analog converter (DAC); forming a digital pulse sequence signal, the forming including applying a first interpolation filter algorithm to determine a first upsampled digital pulse signal based on the first digital signal and a second interpolation filter to determine a second upsampled digital pulse signal based on the second digital signal, the sample rates of the first and second upsampled digital signals matching the sample rate of the DAC; and, providing the digital pulse sequence signal comprising the first and second upsampled digital pulse signals to an input of the DAC to transform the first and second upsampled digital signals into analog pulse sequence signal for controlling the quantum device.

In an aspect, the invention may relate to a system for processing a readout signal of a quantum device comprising: a computer readable storage medium having at least part of a program embodied therewith; and, a computer readable storage medium having computer readable program code embodied therewith, and a processor, preferably a microprocessor, coupled to the computer readable storage medium, wherein responsive to executing the computer readable program code, the processor is configured to perform executable operations comprising: converting an analog readout signal of a quantum computer by an analog-to-digital converter (ADC) into a digital readout signal, the digital readout signal including modulated readout signals, the modulated readout signals comprising a first modulated readout signal modulated at a first frequency and a second modulated readout signal modulated at a second frequency that is different from the first frequency; demodulating the first modulated readout signal into a first demodulated readout signal and downsampling the first demodulated readout signal to a first downsampled demodulated readout signal based on a first downsampling rate factor; demodulating the second modulated readout signal into a second demodulated readout signal and downsampling the second demodulated readout signal to a second downsampled demodulated readout signal based on a second downsampling rate factor, which is different from the first downsampling rate factor; providing the first downsampled demodulated readout signal to a first analysis module to determine a first quantum state of the quantum device represented by the first downsampled demodulated readout signal; and, providing the second downsampled demodulated readout signal to a second analysis module to determine a second quantum state represented by the second downsampled demodulated readout signal.

The invention may further relate to methods and systems aimed to control elements in a quantum circuit that can combine waveforms with different sampling rates into a single output with a constant output sample rate by use upsampling of the waveforms with sample rates lower than the output sampling rate with a dynamically configurable rate-change factor to produce a stream of waveforms with the output sampling rate.

Additionally, the invention may relate to methods and systems aimed to control elements in a quantum circuit that can combine waveforms with different sampling rates into a single output with a constant output sample rate by using and/or adding a plurality of signal paths with different sampling rates, where in signal paths with sampling rates lower than the output sampling rate the sampling rate is upsampled to the output sampling rate before the plurality of signals are summed.

In an embodiment, the upsampling may be carried out by at least one interpolation filter.

In an embodiment, the rate-change factor may be dynamically controlled by a sequence processor using a dedicated instruction.

In an embodiment, a change in pipeline delay (from up or downsampling) may be compensated by controllable delay.

In an embodiment, the pulses may be modulated by an NCO after upsampling and before added to a single output path.

In an embodiment, the NCO may be dynamically controlled from a sequencer by minimally its phase and/or frequency.

The invention may also relate to a computer program product comprising software code portions configured for, when run in the memory of a computer, executing the method steps according to any of process steps described above. In this application the following abbreviations and terms are used:

The invention will be further illustrated with reference to the attached drawings, which schematically will show embodiments according to the invention. It will be understood that the invention is not in any way restricted to these specific embodiments.

DETAILED DESCRIPTION

Delivering instructions to a quantum processor is a complicated process. A quantum processor uses quantum elements, such as quantum bits (qubits), which are based on quantum systems such as trapped ions, trapped electrons, superconducting Josephson junctions, photons, quantum dots, etc. to process information based on quantum mechanical processes such as superposition and quantum entanglement. The information stored and processed by qubits is represented by the physical quantum states of the quantum bits. Typically, these quantum devices are located in a screened, cooled cryogenic environment to suppress the thermal noise that distorts the quantum state of the quantum bits.

In most implementations, a classical control system is used to translate instructions into physical pulses for controlling the quantum processor to perform quantum logic operations, and to measure quantum states of the quantum bits. In addition, a computer is used to upload the control program to the control system and after the execution of the control program, the measured states of the quantum bits are reported back in digital form back to this computer. To alter and readout quantum states digital-to-analog (DAC) and analog-to-digital converters (ADC) are used. In particular, physical signals referred to as control pulses with specific shapes need to be generated to change the state of a quantum element, such as a qubit. The quantum state is measured by sending a specifically shaped pulse to the quantum device and reading back its reflection or transmission. This measurement needs to be digitized and interpreted by the control system which then—in response—decides to generate further control pulses.

Figure 1A:
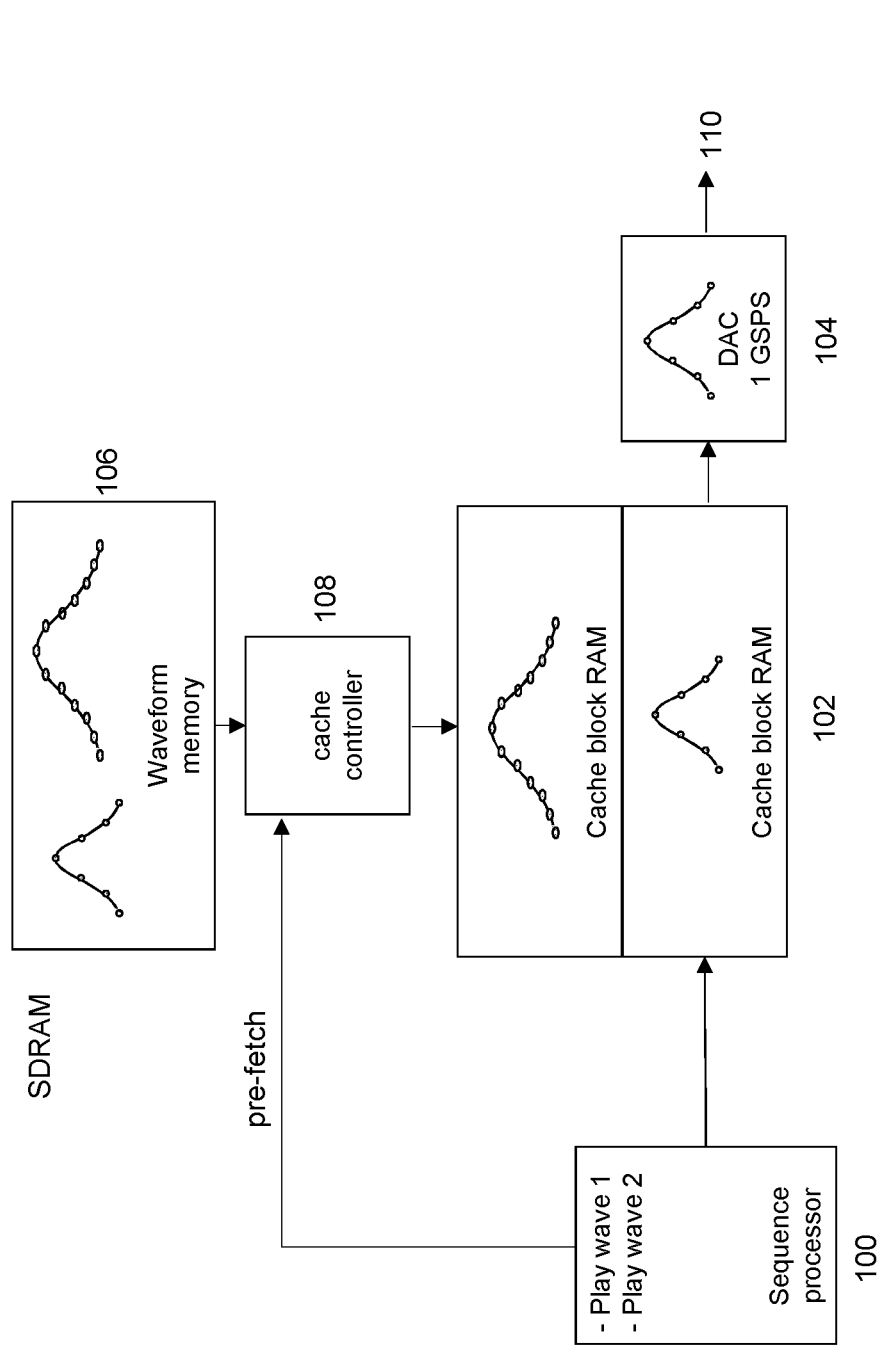
FIGS. 1A and 1B depict schematics of a conventional pulse generator for a quantum device.
Figure 1B:
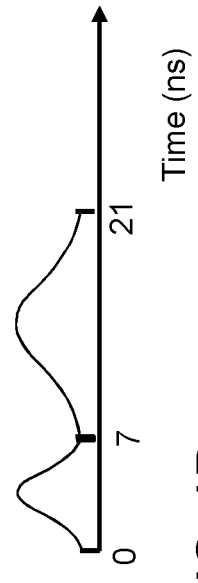

FIGS. 1A and 1B illustrate a pulse sequence generator as known from the article by Colm et al. referred to in the background of this application. The generator includes a sequence processor 100 which is connected to a fast memory 102, e.g. a cache, and a fast digital-to-analog (DAC) converter 104. Due to the high-speed requirements a large part of the generator is implemented as a programmable logic device such as an FPGA. The sequence processor is able to generate pulse sequences by execution of instructions based on a low-level programming language, e.g. assembly. A digital representation of a pulse of a predetermined shape, amplitude and duration is stored and loaded in the memory and subsequently fed into the DAC with a high sampling rate, e.g. 1 Giga sample per second.

A predetermined sequence of control pulses of particular shape and duration may represent a sequence of single or double qubit operations (gate operations) to perform a certain task on the quantum device. Each gate operation represents a particular manipulation of the qubits of the quantum device. The generation of control pulse sequences requires resources to store, compute, and generate such sequences of pulses of approx. 10-1000 ns. To this end, a large number of digital pulse signals with different pulse shapes is digitally stored in an external memory 106. A cache controller 108 is controlled by the sequence processor to pre-load the cache with pulses in accordance with the upcoming instructions that are executed by the sequence processor. This way, a sequence of short pulses in the nanosecond range typically in the range between 10 and 1000 ns as shown in FIG. 1B. The cache is implemented as a two-page cache allowing the cache controller to pre-fetch a set of waves on one page while executing another set on the other page.

Due the sampling speed of the DAC, a large amount of memory is needed to store the pulse shape. For example, a 100 ms pulse generated in 16-bit resolution for a 1 GSPS DAC requires 200 MB of digital memory to store it. This is problematic as the cache is typically implemented as a high-speed onboard block RAM of an FPGA which is typically limited to a few megabytes. However, in many quantum computer implementations to execute an algorithm on a quantum device both long and short pulses are needed, e.g. long pulses in the order of (tens of) milliseconds for initialization and read-out and short pulses are typically 10-1000 nanoseconds that are needed for the qubit operations.

Figure 2C:
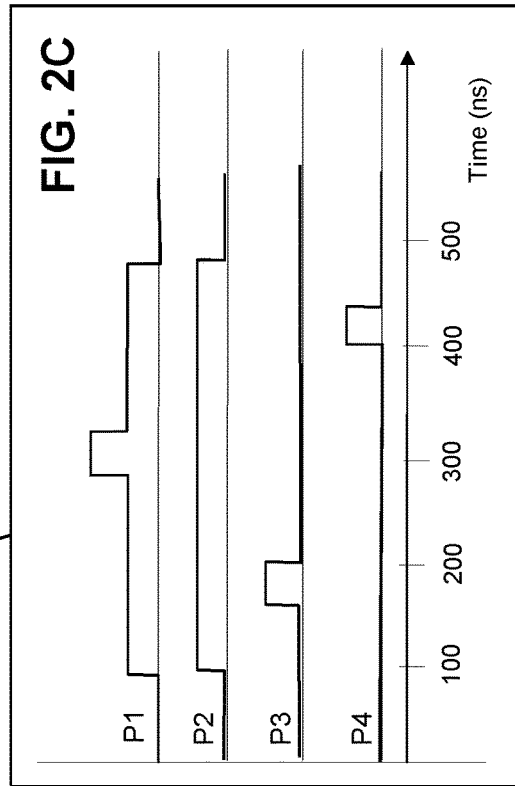
FIG. 2A-2C depict an example of pulse sequences that are required to execute a simple quantum algorithm on a quantum device.
Figure 2B:
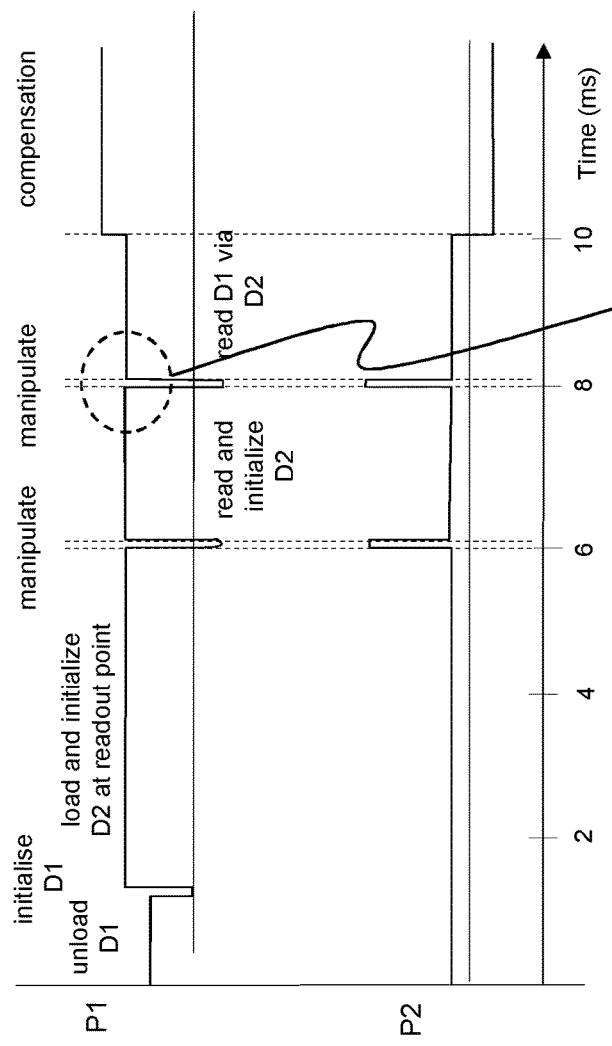
Figure 2A:
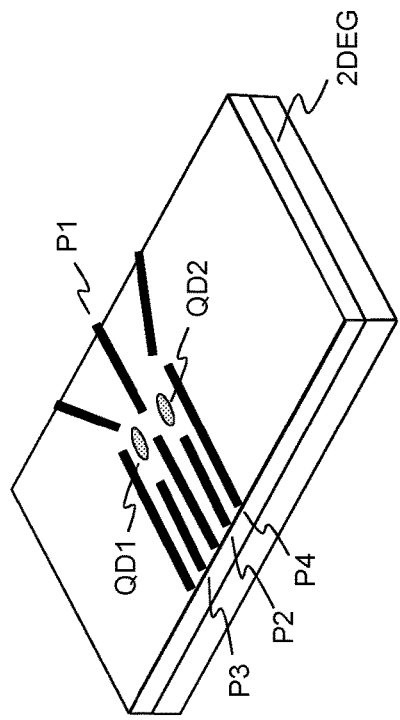

FIG. 2A-2C depict an example of pulse sequences for to executing a simple quantum algorithm on a quantum device, in this case a two spin-qubit processor as described in the article by Watson et al referred to in the background of this application. FIG. 2A depicts an example of a quantum-dot structure including plunger gates for controlling electrons in two coupled quantum dots. As shown in this figure, a plurality of plunger gates P1-P4 are used to form coupled quantum dots Q1 and Q2 in a semiconductor heterostructure comprising a 2D electron gas (2DEG). The gates are coupled to control electronics for generating predetermined pulse sequences to manipulate the electrons in the quantum dot system and to read-out the state of the quantum dot system in response to a manipulation.

FIG. 2B depicts an example of pulse sequences for the execution of a simple program on the two spin-qubit processor of FIG. 2A. The pulse sequence includes a sequence of block pulses of different amplitude and lengths, wherein each pulse represents a certain manipulation of electrons in the quantum dot structure. As shown in this figure, the duration of the pulses is in the 1-10 ms range. These pulses are typically related to initialization and read-out operations. The pulse sequence of FIG. 2B however also includes pulses in the range of 10-1000 ns, i.e. pulses that are orders of magnitude shorter than the pulses that are visible in FIG. 2B. These pulses become visible when looking more closely at certain points in the pulse sequence where the qubit manipulation pulses are generated. This is schematic-ally shown in FIG. 2C, which illustrates the pulses that are applied to gates P1-P4 representing the actual manipulation of the qubits, e.g. single and two-qubit operations, which takes place in a time period of approximately 400 ns. A conventional arbitrary waveform generator (AWG) was used to generate these sequences based on slow digital memory. The control system did not allow dynamic generation of pulse sequences including both long and short pulse shapes that can be generated on the fly, e.g. in response to feedback, e.g. a change in the (quantum) state of the quantum device, thus substantially limiting the ability to execute more sophisticated quantum algorithms on the quantum device.

Figure 3A:
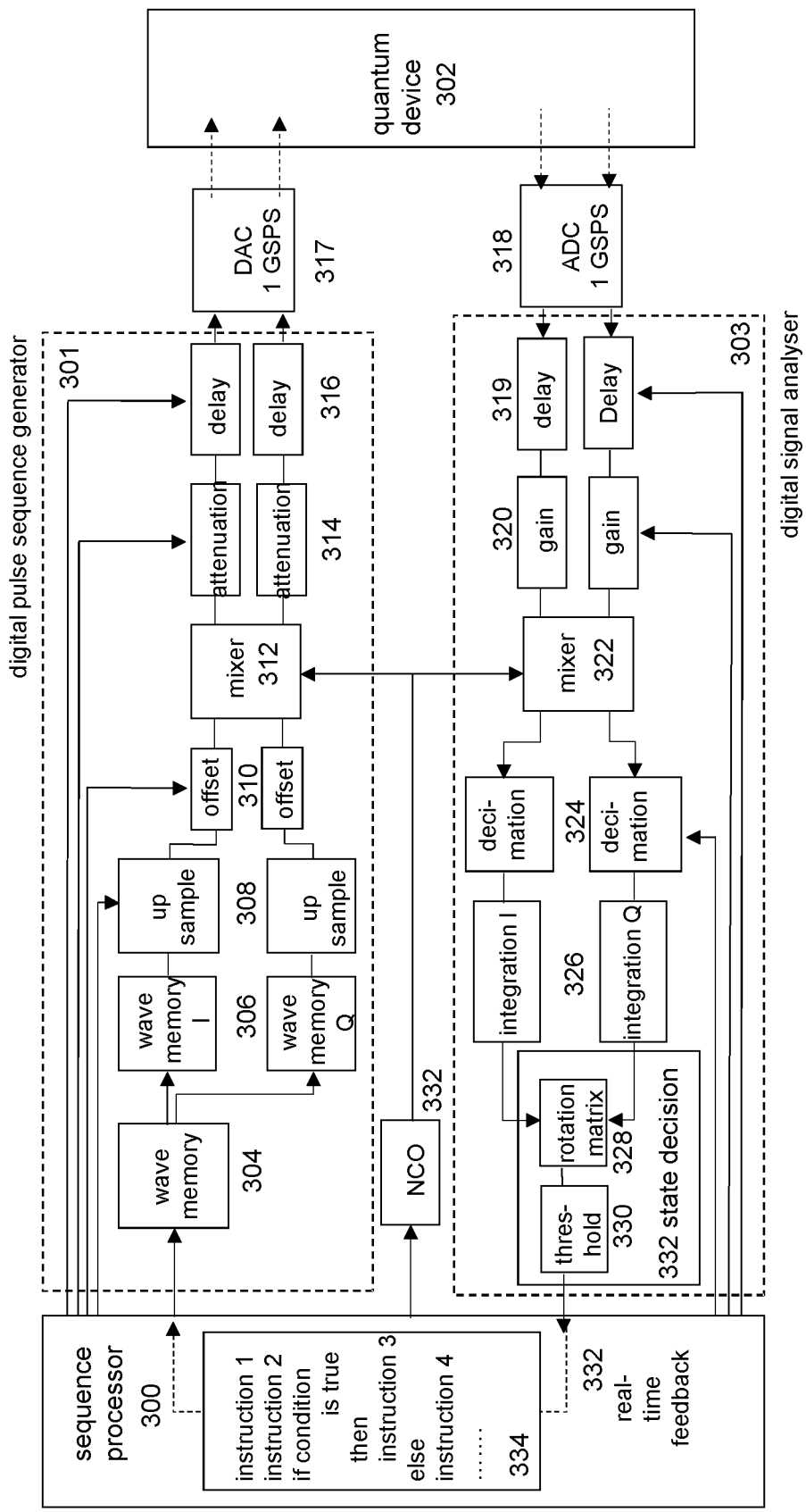
FIGS. 3A and 3B depicts a schematic of a control system for a quantum device and a digital pulse signal generated by such control system according to an embodiment of the invention.
Figure 3B:
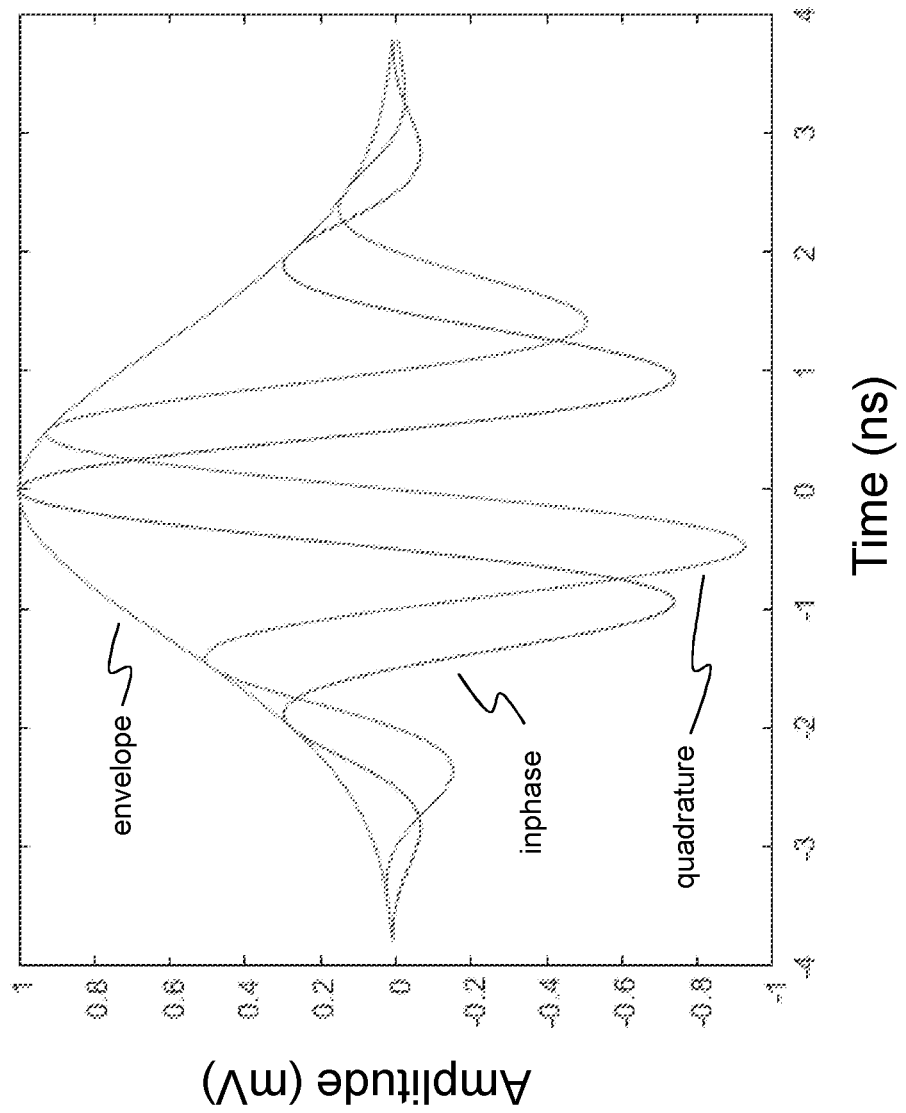

FIGS. 3A and 3B depict a schematic of a control system for a quantum device and a digital pulse signal generated by such a control system according to an embodiment of the invention. As shown in FIG. 3A, the system may include at least one sequence processor 300 to control a digital pulse sequence generator (DPSG) 301, which is configured to dynamically generate an arbitrary digital pulse sequence signal for controlling a quantum device 302. The sequence processor may be configured to execute operations in the form of a software program 334, wherein the operations are configured to control quantum elements of a quantum computer, for example qubit operations such as single qubit or two-qubit operations, and/or initialisation and read-out operations. The sequence processor may be further connected to a digital signal analyser (DSA) 303 configured to process signals originating from the quantum device, in particular signals that are indicative to a state of the quantum device after application of a sequence of pulses to the quantum device by the digital pulse sequence generator. Due to the stringent requirements regarding timing accuracy and latency, at least part of the pulse sequence generator and the digital signal processor may be implemented in a programmable logic device such as an FPGA or any other hardware platform that allows similar performance.

The pulse sequence generator may include a fast memory 304, e.g. a block RAM, in which a plurality of digital signals with a predetermined shape, e.g. a digital pulse signal, may be stored. These digital pulse signals may be stored in a predetermined format, e.g. in the form of a complex representation of the signal, including an inphase (I) part and a quadrature (Q) part of the digital pulse signal. During the execution of the operations of the software program, the sequence generator may dynamically select different digital pulses associated with different sampling rates and instruct an interpolation filter module 308 to upsample each of the pulses based on the sample rate. This way, a sequence of upsampled digital pulse signals is formed. During the formation of the upsampled digital pulse signals an interpolation filter. The upsampling rate is selected such that the sampling rate of the upsampled digital pulse signals is equal to the sampling rate of a digital-to-analog (DAC) converter 317 which converts digital pulse sequence signals into an analogue pulse sequence signal. To that end, in some embodiments, the sequence processor may instruct the upsampling module to use different upsampling rate factors R for different pulses.

In some embodiments, an offset 310 may be applied to a pulse before it is fed to the input of a mixer 312. The mixer may generate (a sequence of) modulated digital pulses by modulating the digital pulses using a sinusoidal signal of a predetermined frequency, which may be generated by a numerically controlled oscillator (NCO) 332. The sinusoidal signal may have a predetermined frequency, amplitude and phase. Each of these signal parameters may be individually controlled by the sequence processor. The frequency may be selected such that modulated pulse interacts with a characteristic frequency of a qubit state. An example of such a modulated pulse signal is depicted in FIG. 3B illustrating the inphase (I) part, the quadrature (Q) part and the envelope of the modulated digital pulse signal. The envelope of the modulated digital pulse signal corresponds to one of the digital pulse signals stored in the memory 304.

In some embodiments, different pulses may be modulated based on different frequencies, wherein each of the frequencies is selected to resonantly interact with resonant structures of the quantum device allowing readout of qubit states based on a resonant structure, e.g. on-chip resonant structures close to the qubit structure for dispersive qubit readout schemes. These modulated pulses may be combined based on frequency-division multiplexing before sent to the quantum device. In other embodiments other types of multiplexing schemes such as time division multiplexing schemes may be used. Further, in some embodiments, modulated pulses may be attenuated 314 and/or a (time) delay 316 may be applied before they are offered to the input of the DAC. For example, in an embodiment, a delay in the data processing due to the upsampling process may be compensated by the delay that is controlled by the sequence processor. This way, the arrival time of the pulse signals at the input of the DAC may be precisely controlled. The output of the DAC may be postprocessed, e.g. filtered, using suitable filters, before the sequence of pluses are transmitted via transmission lines, e.g. coaxial signal lines, to an input, e.g. a control gate, of the quantum device.

Response signals of the quantum elements of the quantum device may be read-out and processed using the digital signal analyzer 303. For example, a modulated readout signal, such as a modulated readout pulse signal, originating from the quantum device may be digitized by a high-speed analog-to-digital converter ADC 318 using a fixed sample rate in the range of Giga samples per second, for example, 1 GSPS. To resolve a quantum state of quantum elements, e.g. qubits, of the quantum device, the modulated readout signal may be demodulated by a mixer 322 using a sine wave generated by the NCO 332, which effectively results in a readout signal representing the envelope of the modulated readout signal. Before demodulation, a (time) delay 319 and/or a gain value 320 may be applied to the modulated signal. The demodulated readout signal originating from the mixer may be subjected to a decimation function 324 and an integration function 326. For optimized readout, often an integration weight function with a specific shape is used. Such integration function may be based on Mode-Matched filtering scheme or an optimal integration filtering scheme, wherein typically the length of the integration function is of the same length as the pulse signals that were sent to the quantum device to initiate a readout. An example of a dispersive readout scheme using such integration function and weight functions is described in the article by Bultink et al, *General method for extracting the quantum efficiency of dispersive qubit readout in circuit QED*, Appl. Phys. Lett. 112, 092601 (2018), which is herewith incorporated by reference in this application.

For example, if it is desired to integrate the demodulated readout signal for 1 ms, over $10^6$ samples and a weight function with at least $10^6$ weights are needed. The storage of these weight functions consumes a considerable amount of memory of the resource expensive block RAM of the digital signal analyzer, which is typically implemented based on a programmable logic device (PLD) such as an FPGA. Hence, after demodulation, decimation module 324 may be configured to reduce the sampling rate may be reduced with a downsampling factor R (with low-pass filtering of the signal to suppress higher Nyquist zones) to reduce the memory needed to store the data (samples and weights) needed for the integration functions 326 with a factor R. Thus, the sample rate of different parts of the demodulated signal can be dynamically reduced with different downsample rate factors. Thereafter, the integrated signal is further fed into a state-decision module that is able to analyze the signal and determine what quantum state the measure signal represents. This module may, for example, include a module 328 to transform the complex signal back into a signal and a thresholding module 330 for making a decision which quantum state the signal represents. The output of the state-decision module may be used by the sequence processor as real-time feedback input that is used when executing the instructions according to the software program. For example, the feedback may be used as a parameter in a conditional instruction that is executed by the sequence processor.

In some embodiments, in case of multiplexed signals, the acquired signals may be split in parallel signal paths, wherein each path includes a digital signal analyzer that has an architecture which is similar to digital signal analyser 303. Such readout structure comprising a parallel arrangement of digital signal analysers allows modulated readout of signals that are modulated with different frequencies to be downsampled with different downsampling rates in order to reduce memory usage and to provide flexible analysis of the multiplexed readout signals. Embodiments of such readout schemes are described hereunder in more detail with reference to FIG. 10-13.

Figure 4A:
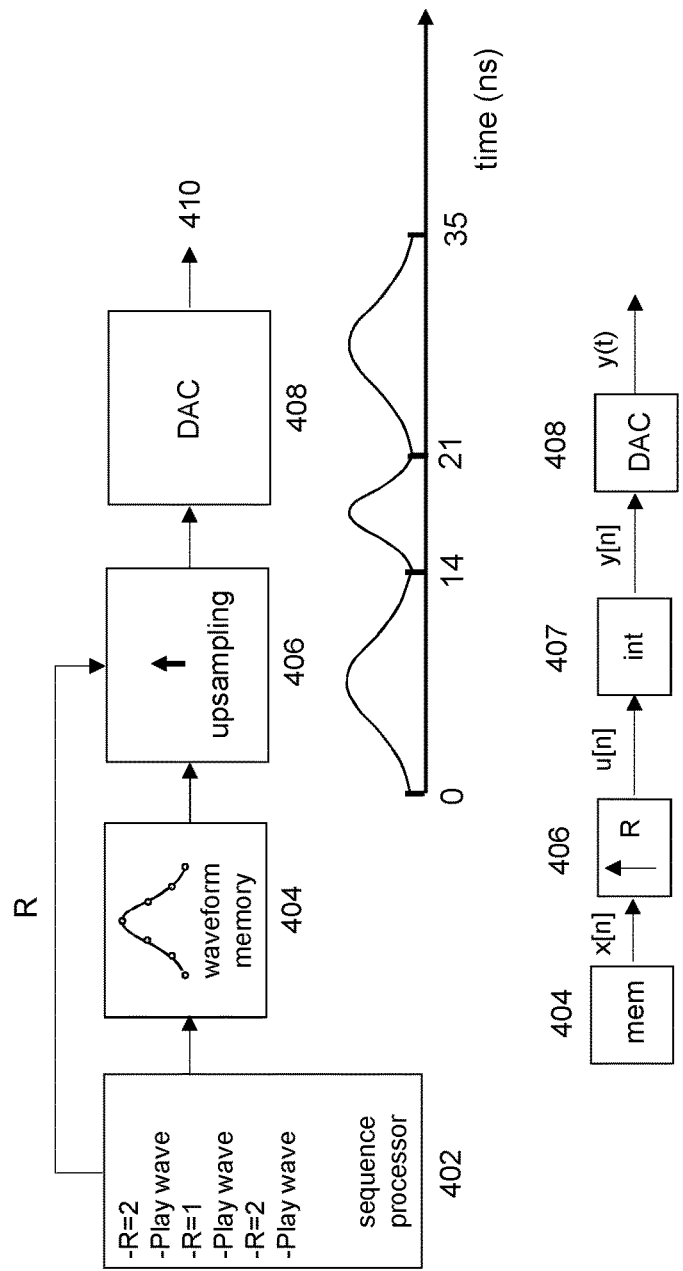
FIGS. 4A and 4B depicts a schematic of part of a control system for a quantum device according to an embodiment of the invention.
Figure 4B:
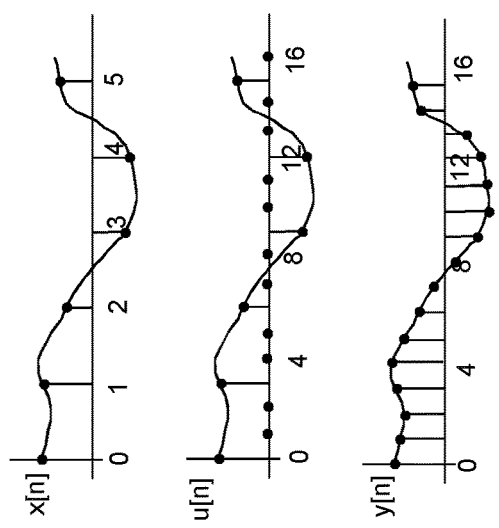

FIGS. 4A and 4B illustrate part of a control system for a quantum device according to an embodiment of the invention. In particular, FIG. 4A depicts a sequence processor 402 connected to a digital pulse sequence generator, which may include a waveform memory 404, an upsampling module 406 and a high-speed DAC 408. In some embodiments, the upsampling module may include or combined with an interpolation filter 407. The memory may be an ultra-fast memory such as a block RAM of the FPGA. A plurality of digital pulse signals may be stored in the block memory. For example, each digital pulse may be stored as a set of data points in the block memory. Each of these stored digital pulse signals may be individually selectable by the sequence processor. A digital pulse may be associated with a sampling rate. The sampling rate of a digital pulse signal may be equal or below the (input) sampling rate of DAC, i.e. the rate at which the DAC would like to receive data at its input, which is typically in the range of one or several GSPSs. For example, in an embodiment, fast (short) digital pulse signals that need to be generated may be in the nanosecond range, e.g. between 10-1000 nanoseconds. Digital signals may be stored as 10-1000 data points and associated with a 1 GSPS sampling rate. In this way, a 100 data point signal may be read out of the memory by the upsampling module at 1 GHz and offered to the input of the DAC at 1 GHz to produce a 100 ns digital pulse. Hence, in that case the upsampling rate R of the upsampling module is unity.

Similarly, in an embodiment, slow (long) digital pulse signals may be in the millisecond range, e.g. between 0.1-10 ms, may be stored as 100-1000 data points and associated with an 1 MSPS sampling rate. In that case, the 100 data point signal may be read out of the memory at a 1 MHz frequency and offered to the input of the DAC at 1 GHz to produce a 100 microsecond digital pulse. Hence, in that case the upsampling rate R is 1000. Hence, the higher the upsampling rate, the lower the frequency that is used to readout the data of the digital pulse from the memory.

The upsampling module may be configured to receive information for determining at what rate data representing a digital pulse should be "played out", i.e. read from. For example, in an embodiment, the upsampling module may be configured to receive a rate change parameter (an upsampling parameter R) from the sequence processor to upsample the digital pulse shape which is stored in the waveform memory and selected by the sequence processor. This way, based on the upsampling parameter R (or information enabling determination of the upsampling parameter R) and the (input) sampling rate of the DAC, the upsampling module may determine which rate (or frequency) it should use to read out the data points from the memory. In some embodiments, a rate change parameter may be stored with the digital pulse signal and the identifier in the memory. Alternatively, instead of an upsampling rate, the upsampling module may receive a readout frequency for reading data representing a digital signal out of the memory. The upsampling module will use this frequency to read data representing the digital pulse from the memory and upsample the signal so that it can offer an upsampled signal to the DAC at a frequency that matches the sampling rate of the DAC.

The digital pulse signals may be stored in the memory, e.g. a block RAM, in different formats, e.g. as a table, wherein each data set representing a signal may be associated with an identifier. Further, the upsampling module 406 may comprise an upsampling algorithm and an interpolation algorithm to generate and process additional data points during upsampling. FIG. 4B depicts an example of an upsampling and filtering process in more detail. As shown in this figure, x[n] represents an original sequence of data points of a digital signal stored in the waveform memory, this sequence may be used as an input signal to an upsampling module. The upsampling module may read data points from the memory at a certain sampling frequency, for example 333.3 MHz. Then, an upsampling algorithm of the upsampling module may generate an upsampled sequence u[m] of data points by upsampling the original sequence x[n] of data points based on a predetermined upsampling factor, e.g. in this example an upsampling factor R=3. The upsampling algorithm inserts for each original data point x[n], R−1=2 extra data points of zero value to the sequence, effectively increasing the number of data points by a factor of 3. This intermediate signal u[n] is shown in FIG. 4B. hereafter, optionally, an interpolation algorithm may be used to determine interpolated values for the added data points. After interpolation, the upsampling module offers the data of the upsampled and interpolated sequence y[n], the output signal of the upsampling module, to the input of a DAC. This output signal with have a frequency that is R times the frequency of the input signal. Hence, in the present case, the output frequency of the upsampling module is approx. 1 GHz, i.e. the processing frequency of the DAC.

Known interpolation filters or a cascade of interpolation filters may be used. Such filters include infinite input response (IIR) and finite input response (FIR) filters and combinations thereof. Thus, if the original data sequence (the input signal of the upsampling module) has a sampling period T and a sampling frequency $f_s$, the new sampling period becomes T/R, so that the new sampling frequency (the output signal of the upsampling module) is $f_R = R \cdot f_s$. To remove spectral replicas due to Nyquist effects, the stop frequency of the interpolation filter may be set to $f_R/2$. In this way, a digital pulse of 100 data points may be used for generating a fast 100 ns pulse. In order to a generate output signal of a sampling frequency of one GHz (that matches the sampling rate of the DAC), the upsampling factor of the upsampling module may be set to one. The same data points may be used for generating a 100 microsecond pulse with the DAC. In that case, the upsampling factor may be set to R=1000.

Hence, the sequence processor may control a digital pulse sequence generator to dynamically, i.e. in response to a condition or feedback, select a digital pulse signal stored in the memory, to upsample the selected digital pulse signal and to process the selected upsampled digital pulse signal based on the interpolation filter for obtaining an upsampled pulse signal that has a sample rate that matches the sample rate of a high-speed DAC. This way, the digital pulse sequence generator is capable of sequentially processing digital pulse signals of different lengths (different sampling rates) in a simple and controlled way. A multitude of digital pulse signals (a sequence of pulses) can be generated by simply selecting a digital pulse signal from the block memory and instructing an upsampling module to upsample the signal to the sampling frequency of the DAC based on a rate change parameter R or based on information for determining the rate change parameter R. In a similar way, a digital signal analyzer may include a downsampling module to downsample a demodulated readout signal.

The architecture of the digital pulse sequence generator is particular advantageous in terms of memory usage as the digital pulse shapes may have relatively low sampling rates. Additionally, the architecture is simple and does not require complex caching schemes to dynamically construct a sequence of pulses with different shapes and durations, including pulse sequence comprising relatively short pulses (in the ns range) and relatively long pulses (in the ms range). Finally, the architecture is particularly suitable for execution of a program that requires low-latency feedback (e.g. in case of a conditional operation) as all digital pulse signals can be stored in the fast block memory. The same advantages are valid for the digital signal analyzer.

Figure 5:
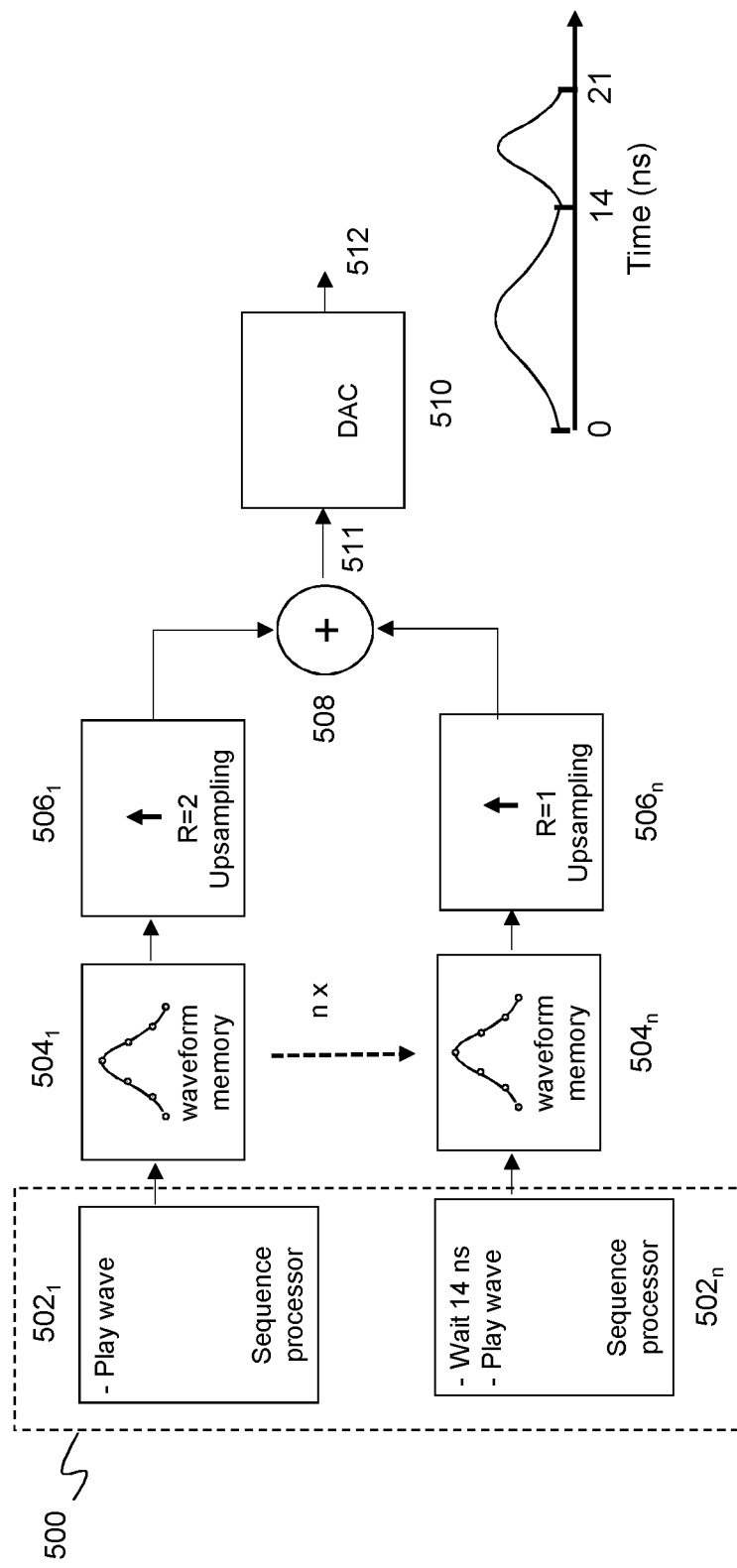
FIG. 5 depicts a schematic of part of a control system for a quantum device according to another embodiment of the invention.

Other architectures that enable dynamic generation of a pulse sequence based on different upsampling rate factors are also possible. For example, FIG. 5 illustrates part of a control system for quantum device according to another embodiment of the invention. In this embodiment, the system may include a processor including a plurality of different sequence processor $502_{1-n}$ wherein each sequence processor is connected to a fast memory $504_{1-n}$, e.g. an onboard FPGA block RAM, and an upsampling filter module $506_{1-n}$. In some embodiments, the upsampling module may include or combined with an interpolation filter in a similar way as described with reference to FIGS. 4A and 4B. Based on the digital pulse signals stored in the memory, a sequence processor may control the generation of a pulse sequence using the upsampling module, and, optionally, an interpolation filter module. This way, the system includes n parallel signal paths, wherein each signal path is controlled by a sequence processor. The digital pulse signals that are generated in the different signal paths may be added by a summer 508 and the resulting sequence of pulses, a digital pulse sequence signal 511 may be provided to the input of the DAC 510, which transforms the digital pulse sequence signal into an analoug pulse sequence signal 512.

Thus also in this embodiment, the upsampling module may comprise an upsampling algorithm and an interpolation algorithm. However, in contrast to the embodiment of FIG. 4, a sequence processor may not have dynamic control over the upsampling rate during the generation of pulse signals. Instead, the sample conversion rate of each signal path may be independently set. For example, in an embodiment, the sample conversion rate of each upsampling module may be set to a fixed value upon initialisation of the system. This way, each upsampling may be set to a fixed, but different upsampling rate factor. During the execution of instructions of a program by the sequence processors, the sampling rate stays the same for each signal path. Hence, to generate a sequence of pulse signals, the sequence processors may be synchronized so that they can be executed in parallel. This way, a fast pulse (with low upsampling factor R) may be generated by a first sequence processor associated with a first signal path that includes a first memory block and first upsampling module and a slow pulse (with high upsampling factor R) may be generated by a second sequence processor associated with a second signal path that includes a second memory block and second upsampling module.

In an embodiment, the sequence processors may form (sub-)processors controlled by a (main) processor 500. This main processor may control the execution and/or synchronization of the sequence processors. In a further embodiment, instead of individual sequence processors, one (main) sequence processor may control of the generation of the pulse signals by the modules of the different signal paths.

The generation of the pulse signals may be synchronized so that the software program that is executed on the sequence processors may instruct a first sequence processor to generate a first digital pulse signal based on a first stored digital signal pulse of a first sample rate, while a second sequence processor is instructed to wait a predetermined time period before generating a second digital pulse signal based on a second stored digital signal pulse of a second sampling rate. Combining the two generated pulses will result in a digital pulse sequence signal comprising two pulse signals, that may or may not overlap. Thus, based on the timing of the generation of the pulse signals by the different signal paths, digital pulse sequences comprising a plurality of pulse signals in series without any overlap or digital pulse sequences comprising a plurality of pulse signals wherein at least part of the pulse signals may overlap, may be generated. Hence, in this embodiment, pulses can be generated in parallel and added together, even if they (partially) overlap.

Figure 6:
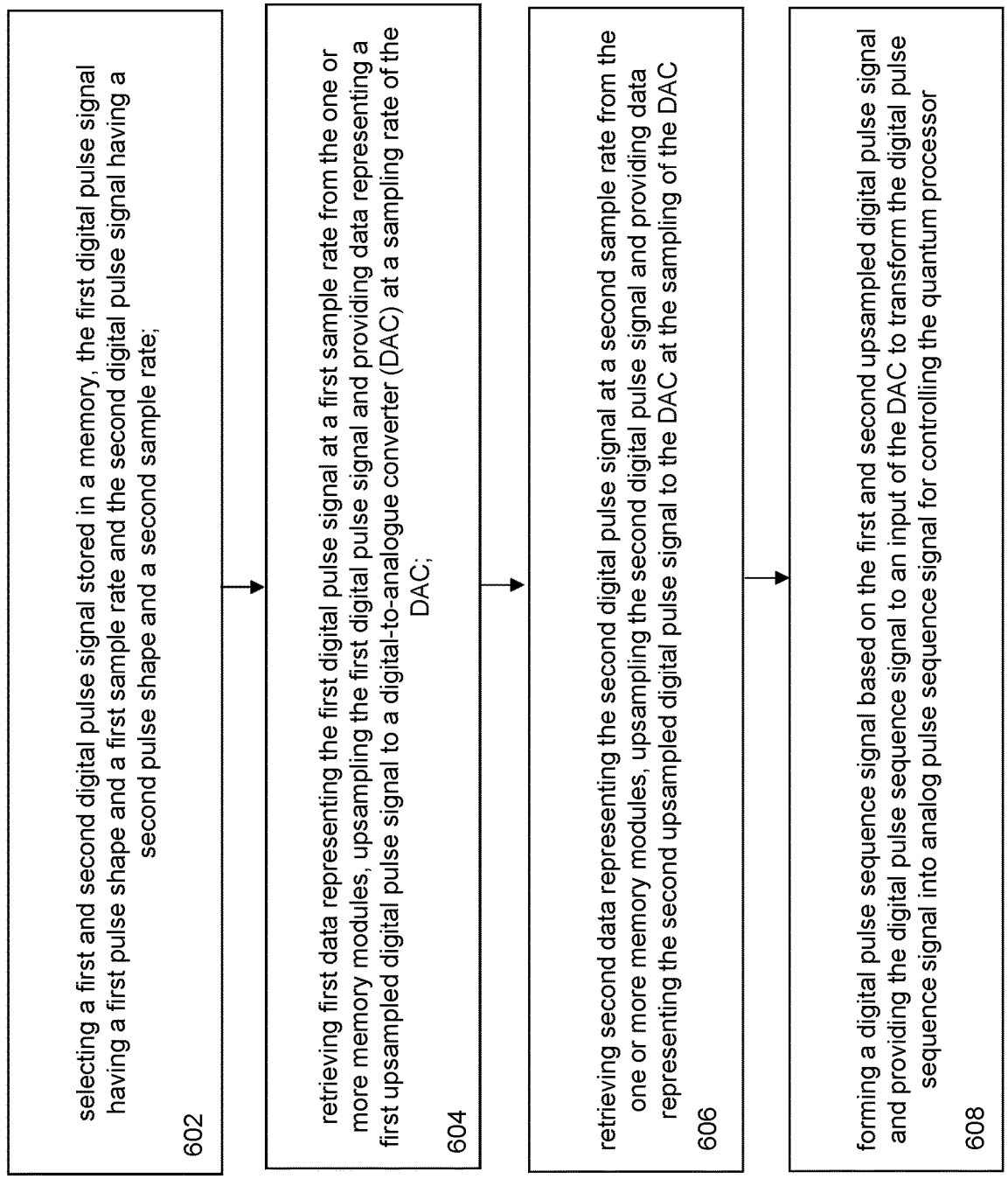
FIG. 6 depicts a process flow for controlling a quantum device according to an embodiment of the invention.

FIG. 6 depicts a process flow for generating a signal for controlling a quantum device according to an embodiment of the invention. Typically, these methods and systems may include one or more processors, e.g. a sequence processor as depicted in FIG. 4 or a system of sequence processors as depicted in FIG. 5, to execute a sequence of instructions of a software program. The sequence processor or sequence processor system may be connected to a pulse sequence generator that includes digital pulse signals stored in a fast memory and an upsampling module. The pulse sequence generator may generate a digital pulse sequence signal for a digital-to-analog converter (DAC) for converting the digital pulse sequence signal into an analog pulse sequence signal. Typically, at least part of the pulse sequence generator may be implemented as a programmable logic device (PLD) such as an FPGA including fast onboard block RAM. The sequence processor may use the pulse sequence generator to translate the sequence of instructions into sequences of pulses of particular shapes and durations to physical control parts, e.g. quantum elements and/or resonators, of or associated with the quantum device.

The method may include selection of at least a first and second digital signal by the processor (step 602). The selection may be based on instructions of a program that is executed by the processor. The first digital signal may be stored in a memory, typically a fast, dedicated memory such as block RAM. Typically, the memory may include a plurality of different digital signals which can be selected by the processor according to the instructions it is executing. The stored first and second digital signals may have a first and second pulse shape. Further, these signals may be associated with a first and second sampling rate respectively. This sampling refers to the sampling rate that an upsampling module uses to read data representing a selected digital pulse signal from the memory. The first and second sampling rate may or may not be lower. Preferably at least one of the sampling rates is substantially lower than an output sampling rate of a digital-to-analog converter (DAC). This way, multiple digital signals can be efficiently stored in the memory.

Then, first data representing the first digital pulse signal may be retrieved at a first sample rate from the one or more memory modules. For example, an upsampling module may retrieve the data from the memory and upsample the first digital pulse signal into a first upsampled digital pulse signal which is to a digital-to-analogue converter (DAC) at a sampling rate of the DAC (step 604). In some embodiment, a first interpolation filter may be applied to a first upsampled digital signal before it is provided to the DAC.

Further, the second data representing the second digital pulse signal at a second sample rate from the one or more memory modules. An upsampling module may upsample the second digital pulse signal into a second upsampled digital pulse signal, which is provided to the DAC at the sampling of the DAC (step 606). A second interpolation filter may be applied to the second upsampled digital signal before it is provided to the DAC.

Based on the first and second upsampled digital pulse signal, a digital pulse sequence signal is formed, which is provided input of the DAC to transform the a digital pulse sequence signal into analog pulse sequence signal for controlling the quantum device.

The upsampling and, optionally, the filtering may be implemented as a configurable upsampling module as described with reference to FIG. 4.

In an embodiment, such configurable upsampling module may be configured the receive instructions from a sequence processor. For example, the upsampling module may receive upsampling information, e.g. a first upsampling rate factor to process (upsample and interpolate) the first digital signal based and a second upsampling factor to process (upsample and interpolate) the second digital sample. The upsampling may be configured so that the sample rates of the first and second upsampled digital signals match the sample rate of the DAC. In another embodiment, the upsampling information may be stored as metadata in a memory. Thus, when the upsampling module receives an instruction to upsample a digital pulse signal, it may retrieve the data representing the digital pulse signal and the metadata associated with the digital pulse signal from the memory.

Alternatively and/or in addition, the execution of the upsampling may include a scheme as described with reference to FIG. 5, including a system of sequence processors wherein each sequence processor controls the processing of digitally stored pulse signals using an upsampling module. The program executed by the sequence processors may instruct a first sequence processor to generate a first upsampled digital signal and a second sequence processor to generate the second upsampled digital signal. A digital pulse sequence signal may be formed based on the first and second upsampled digital pulse, which is then provided to the DAC to transform the digital pulse sequence signal into an analog pulse sequence signal for controlling the quantum device (step 606).

Figure 7:
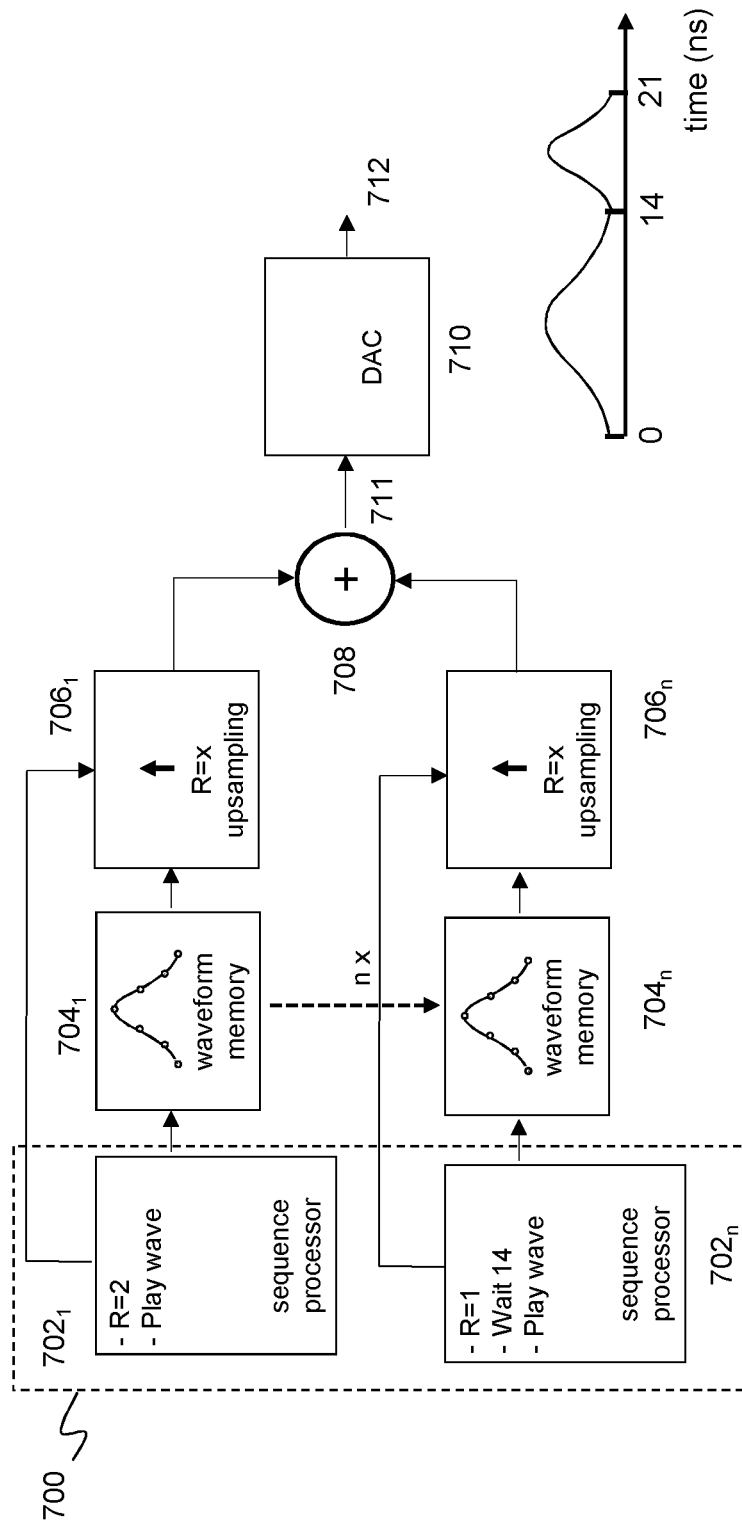
FIG. 7 illustrates part of a control system for a quantum device according to yet another embodiment of the invention.

FIG. 7 illustrates part of a control system for quantum device according to yet another embodiment of the invention. In this embodiment, the system may include a processor including a plurality of different sequence processors $702_{1-n}$ similar to the embodiment of FIG. 5. Also, in this case, the sequence processors may be executed and/or synchronized by a main processor 700. Each sequence processor is connected to a fast memory, for example a memory block $704_{1-n}$, and an upsampling module $706_{1-n}$. However, in contrast to the embodiment of FIG. 5, the upsampling rate of the upsampling modules $706_{1-n}$ is not fixed but can be dynamically set by the sequence processor in a similar way as described with reference to FIG. 4. Hence, this embodiment is a combination of the embodiments of FIGS. 4 and 5 and thus allows dynamic changes in the upsampling rate of the interpolation filter in one signal path and the simultaneous generation of multiple digital pulse signal based on stored digital pulse signals with different sample rates in different sampling paths. The digital pulse signals that are generated in the different signal paths may be added by a summer 708 and the resulting sequence of pulses, a digital pulse sequence signal 711 may be provided to the input of the DAC 710, which transforms the digital pulse sequence signal into an analoug pulse sequence signal 712.

Figure 8:
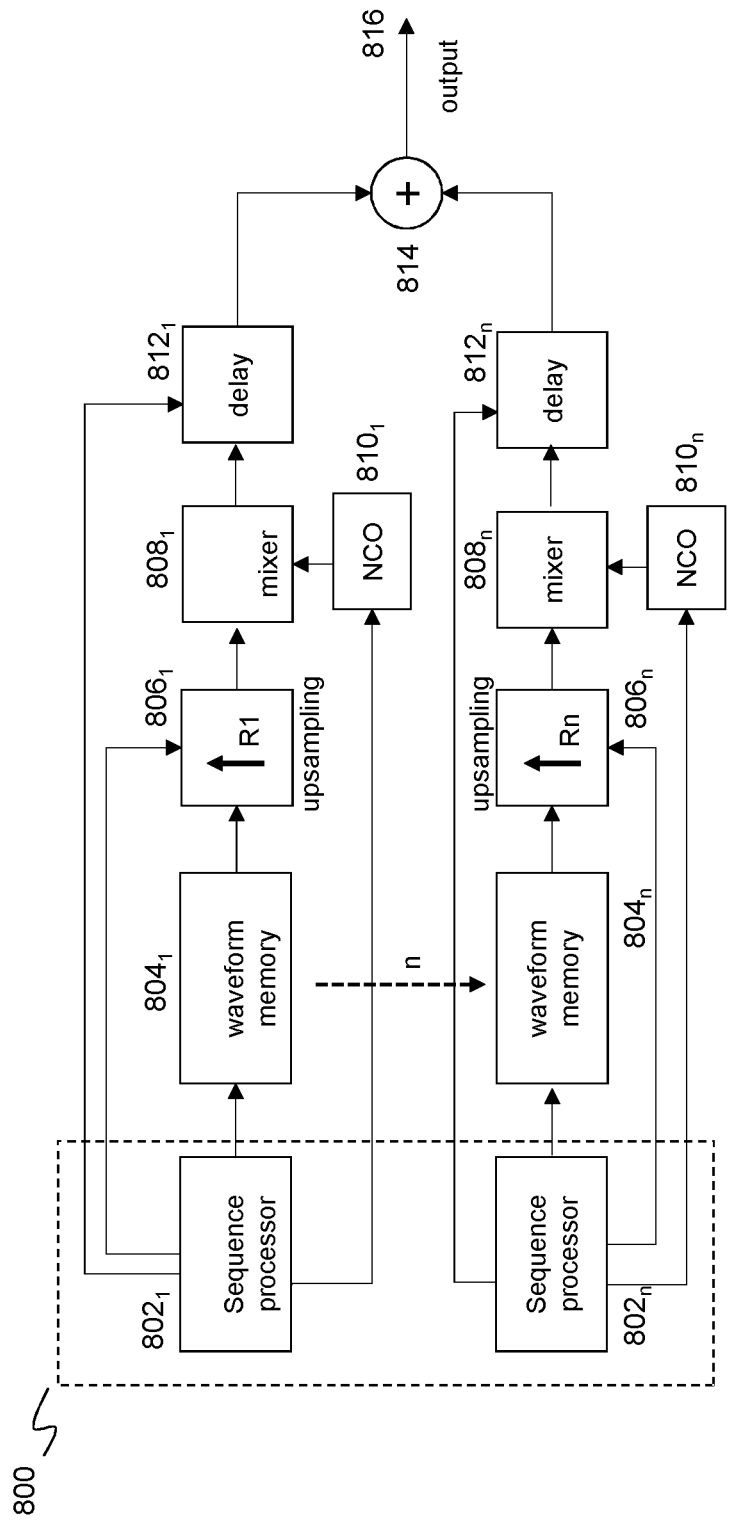
FIG. 8 illustrates part of a control system for a quantum device according to yet another embodiment of the invention.

FIG. 8 illustrates part of a control system for a quantum device according to a further embodiment of the invention. In this embodiment, the system may include a processor including a plurality of different sequence processors $802_{1-n}$ similar to the embodiment of FIGS. 5 and 7, which may be executed and/or synchronized by a main processor 800. Each sequence processor may be connected to a fast memory, e.g. a one of the memory blocks $804_{1-n}$, and upsampling modules $806_{1-n}$, which together define a signal path. Also in this case, the upsampling modules may be controlled by the sequence processors to dynamically change the upsampling rate.

After a selected digital pulse signal is upsampled and, optionally, interpolated by the upsampling module, further signal conditioning steps may be applied to the upsampled digital pulse signal in a signal path. For example, as already described with reference to FIG. 3, a mixer $808_{1-n}$ may modulate the upsampled digital pulse signal with a sinusoidal signal generated by a numerically controlled oscillator (NCO) $810_{1-n}$, which is controlled by a sequence processor. As shown in this embodiment, each signal path may have its own NCO that is controlled by the sequencer processor that controls the modules (memory, upsampling, mixer, NCO, delay) in a particular signal path. The NCO may generate sines and cosines at a frequency up to half the sample rate of the DAC. The sequence processor may control the phase and frequency of the NCO, so that individual pulse signals may be modulated with different frequencies and phase offsets.

The data processing needed for upsampling a digital pulse signal may cause different processing delays in the signal paths which are controlled by the time-synchronized sequencer processors. These delays may be compensated by a delay module $812_{1-n}$ in each signal path, which is controlled by the sequence processor. This way, the arrival time of the pulse signals at the adder 814 may be precisely controlled. Finally, the digital pulse signals that are generated in the different signal paths may be added by a summer 814 and the resulting sequence of pulse, a pulse sequence signal 816, may be provided to the input of the DAC (not shown).

Figure 9:
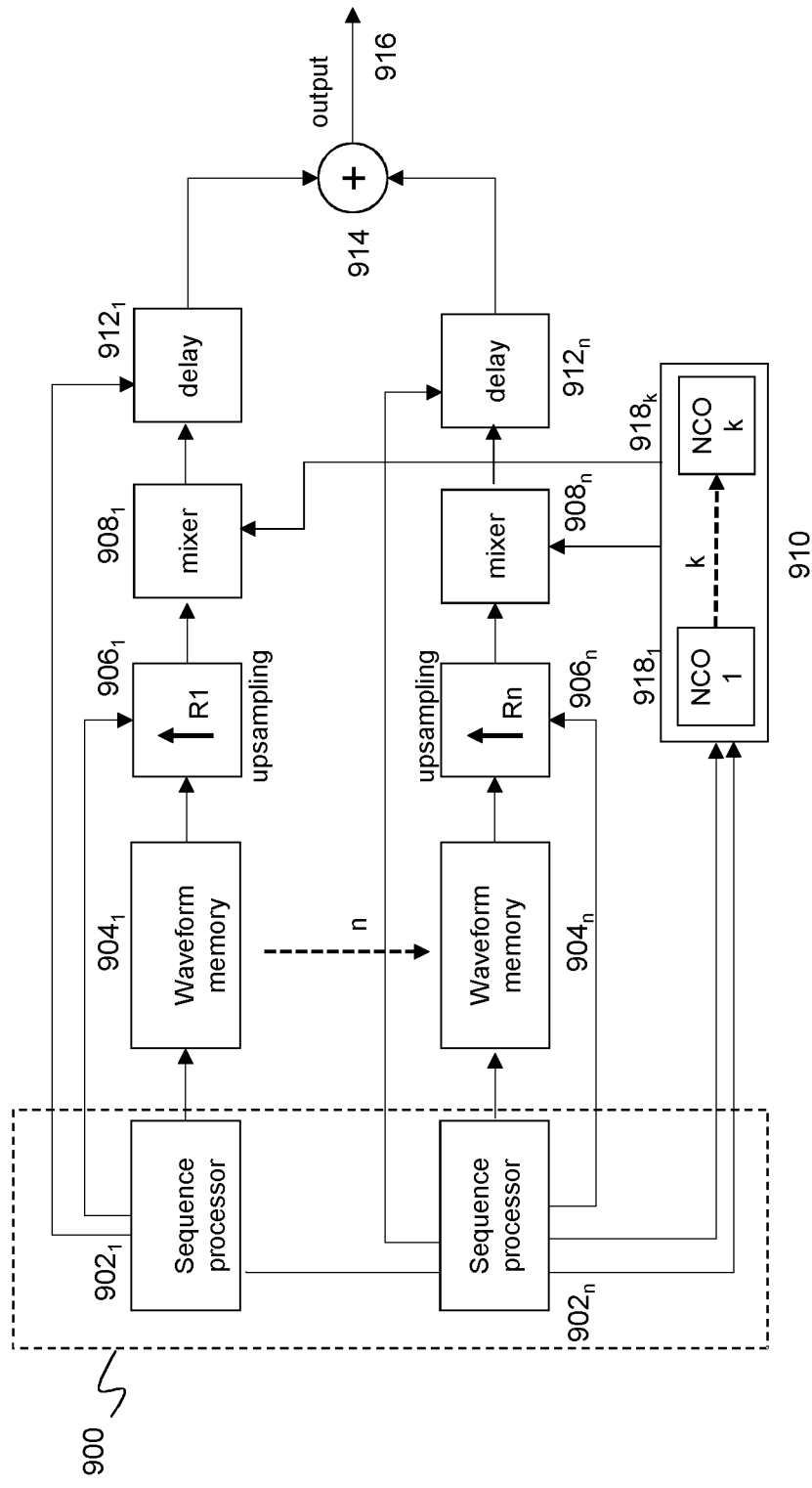
FIG. 9 depicts part of a control system for a quantum device according to an embodiment of the invention.

FIG. 9 illustrates part of a control system for a quantum device according to an embodiment of the invention. This system may be similar to the system described with reference to FIG. 8, i.e. a plurality of sequence processors $902_{1-n}$, wherein each sequence processor is connected to one of the memory block $904_{1-n}$, upsampling modules $906_{1-n}$, mixers $908_{1-n}$ and delay modules $912_{1-n}$. However in this particular embodiment, the number k of NCOs may be different from the number n of signal paths. To that end, the system may comprise an oscillator system 910 comprising multiple (k) NCOs $918_{1-k}$ that run in parallel. A sequence processor of a signal path may be connected to the oscillator system. This way, the sequence processor may select which NCO the mixer should use for the modulation of a pulse signal that is generated.

Figure 10A:
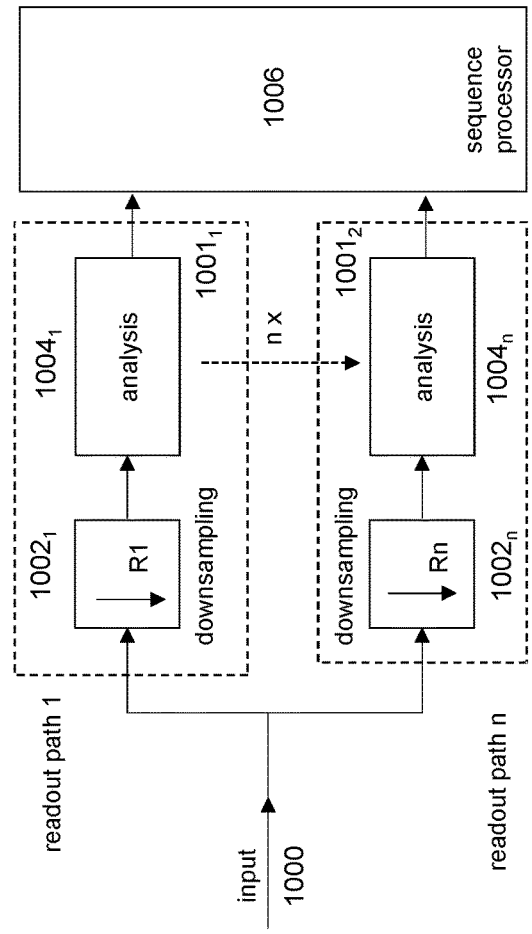
FIGS. 10A and 10B depict part of a control system for a quantum device according to an embodiment of the invention.
Figure 10B:
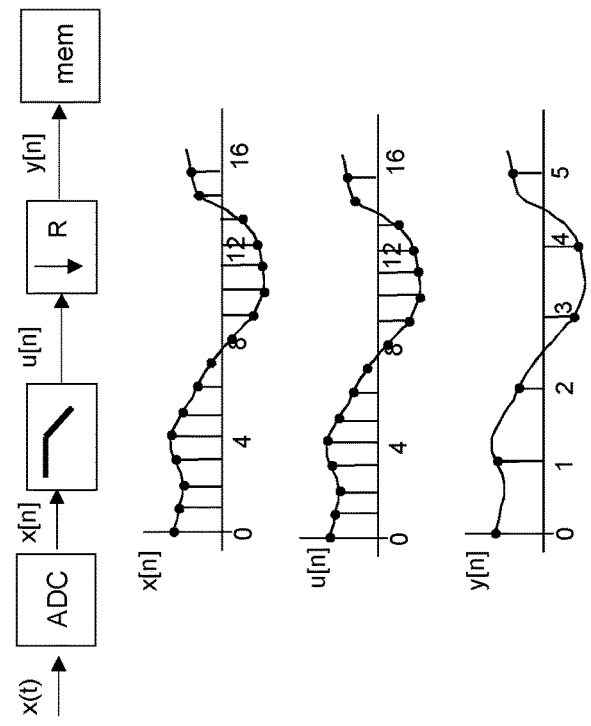

FIGS. 10A and 10B illustrate part of a control system for quantum device according to an embodiment of the invention. In particular, FIG. 10A depicts a high-level schematic of part of a data acquisition system that is used to perform readout of the quantum device. The data acquisition system may be implemented as a dedicated system of digital signal analysers in a similar way as the pulse sequence generators as described e.g. with reference to FIGS. 4 and 5 above. Both the pulse sequence generators and the digital signal analysers are controlled by one or more sequence processors as for example described with reference to FIG. 3A. This figure shows that the data acquisition part of the control system may include a high-speed analog-to-digital converter ADC for converting an analog readout signal originating from the quantum device into a digital readout signal which may have a sampling rate of about 1-10 giga samples per second (GSPS). Typically, the readout signal originating from the quantum device and thus the digital readout signal may be a frequency-division multiplexed signal including different signal parts that are modulated at different frequencies.

Hence, the input signal in FIG. 10A represents a digital readout signal 1000 that is analysed at a plurality of time scales. A plurality of digital signal analysers $1001_{1-n}$ are arranged to process the plurality of readout signals, wherein each of the plurality of digital signal analysers $1001_{1-n}$ is configured to process signals belonging to one time interval. This way, the parameters of each digital signal analyser, including the downsampling rate factor of the downsampling module, can be adapted to and optimized for readout signals on a particular time scale.

As shown in the figure, the digital signal analyser may form parallel readout paths, e.g. readoutpaths 1-n, wherein each digital signal analyser includes a number of signal processing modules (decimation, integration, state decision) which are configured to analyze a readout signal at a specific time scale. A downsampling module $1002_{1-n}$ is used to downsample the readout signal before it is integrated into a readout signal that can be input to a signal analysis module $1004_{1-n}$. The digital signal processors $1000_{1-n}$ of the different data processing paths may use different downsampling rates. Each modulated readout signal may be selected by a digital signal analyser. The signal analysis module may include data processing functions that are adapted to determine which quantum state the measured signal represents.

For optimized readout, an integration weight function is used with a specific shape. Integration for 1 ms, requires integration over $10^6$ samples and a weight function with $10^6$ weights. Storing these weight functions consumes a considerable amount of memory so downsampling with a downsampling rate factor R may be used (including low-pass filtering of the signal to suppress higher Nyquist zones). This way, the amount of memory needed to store the integration functions is reduced with a factor R. The result of the analysis by each digital signal processor may be provided to the sequence processor 1006 which may use these results in the execution of further instructions of a software program that runs on the sequence processor.

FIG. 10B depicts the downsampling process that is executed by each digital signal processor. This process may also be referred to as decimation. As shown in this figure, x[n] represents an original sequence of data points of the modulated readout signal x(t) originating from the quantum device. This sequence of data points may be filtered using an anti-aliasing filter to suppress higher Nyquist zones. The filtered sequence of data points u[n] is then subjected to a downsampling processor based on a downsampling rate factor R (which in this example is R=3). This way, a set of downsampled values y[n] may be generated and stored in a memory for further processing. The downsampling process effectively discards R−1=2 data points for every R samples, thereby decreasing the number of data points by a factor of 3. The sampling rate is now R times lower than the original sampling rate.

Figure 11:
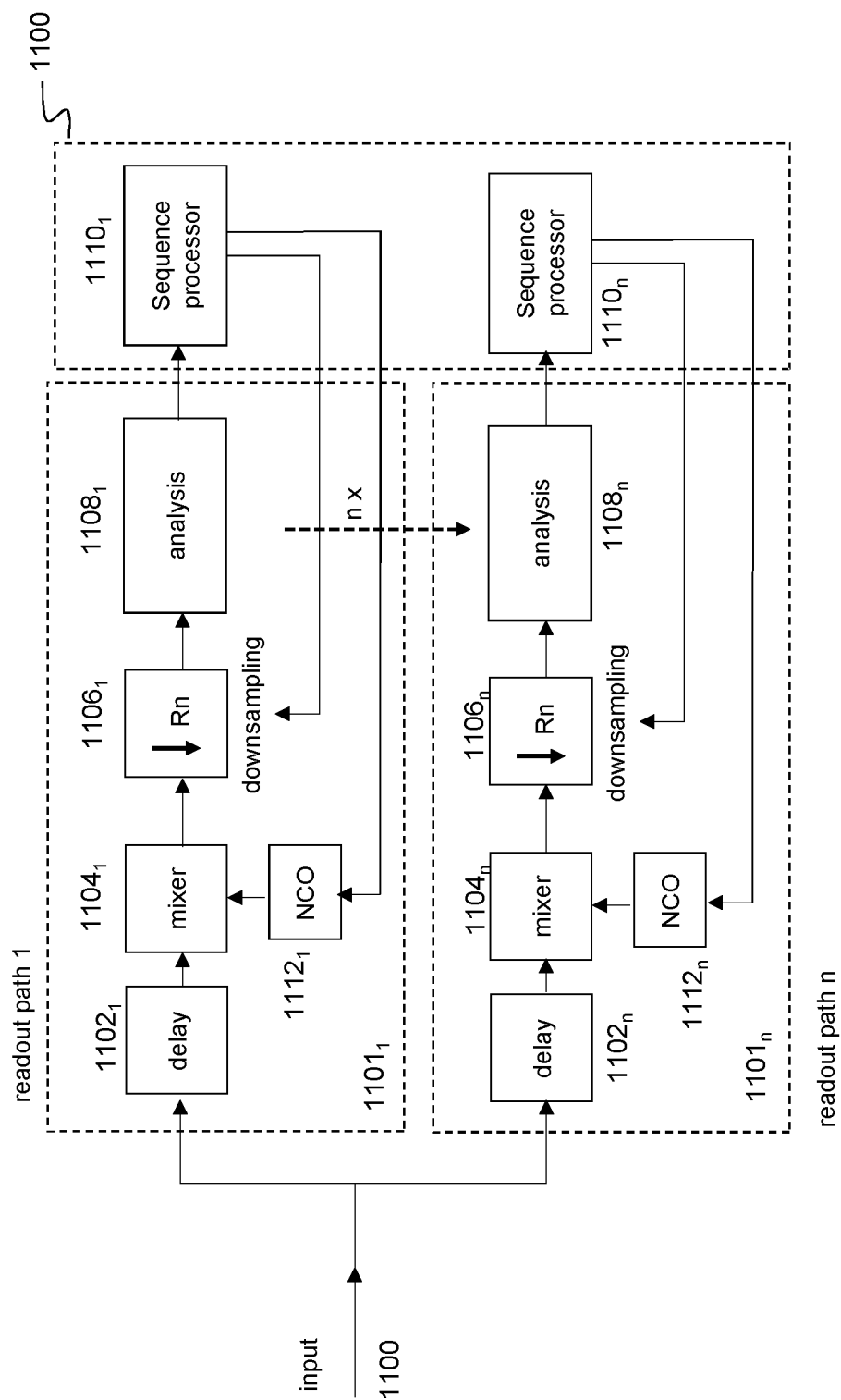
FIG. 11 depicts part of a control system for a quantum device according to an embodiment of the invention.

FIG. 11 illustrates part of a control system for quantum device according to an embodiment of the invention. In particular, FIG. 11 depicts a more detailed embodiment of a digital signal analyser system as described with reference to FIG. 10. Similar to FIG. 10, the digital readout signal 1100 may be a frequency-division multiplexed readout signal including modulated signals that are modulated using different modulation frequencies. The digital readout signals may be split into a plurality of modulated readout signals wherein modulated readout signals belonging to a particular modulation frequency are processed by one of a plurality of digital signal processors $1101_{1-n}$.

As shown in the figure, the digital signal analysers may form parallel readout paths wherein each digital signal analyser includes a number of signal processing modules including a delay module $1102_{1-n}$, a mixer $1104_{1-n}$ connected to a numerically controlled oscillator $1112_{1-n}$, a downsampling module $1106_{1-n}$, and an analysis module $1108_{1-n}$. These signal analysis modules are configured to transform a modulated readout signal associated with a particular modulation frequency into a signal that is suitable for input to the analysis module. The analysis module is configured to determine a state of the quantum device, e.g. a qubit state, on the basis of an input signal. The output of the analysis module is provided to the sequencer, which may use this information in the execution of instructions of a software program for controlling the quantum device as e.g. described with reference to FIG. 3A. As shown in this figure, during the processing of the modulated readout signal, the sequence processor may control the digital signal analyser by setting the frequency of the NCO to a particular demodulation frequency. Further, it may set the downsampling rate of the digital signal processor. This way, each digital signal processor of the plurality of digital signal processor may be adapted to a specific demodulation and downsampling scheme.

Figure 12:
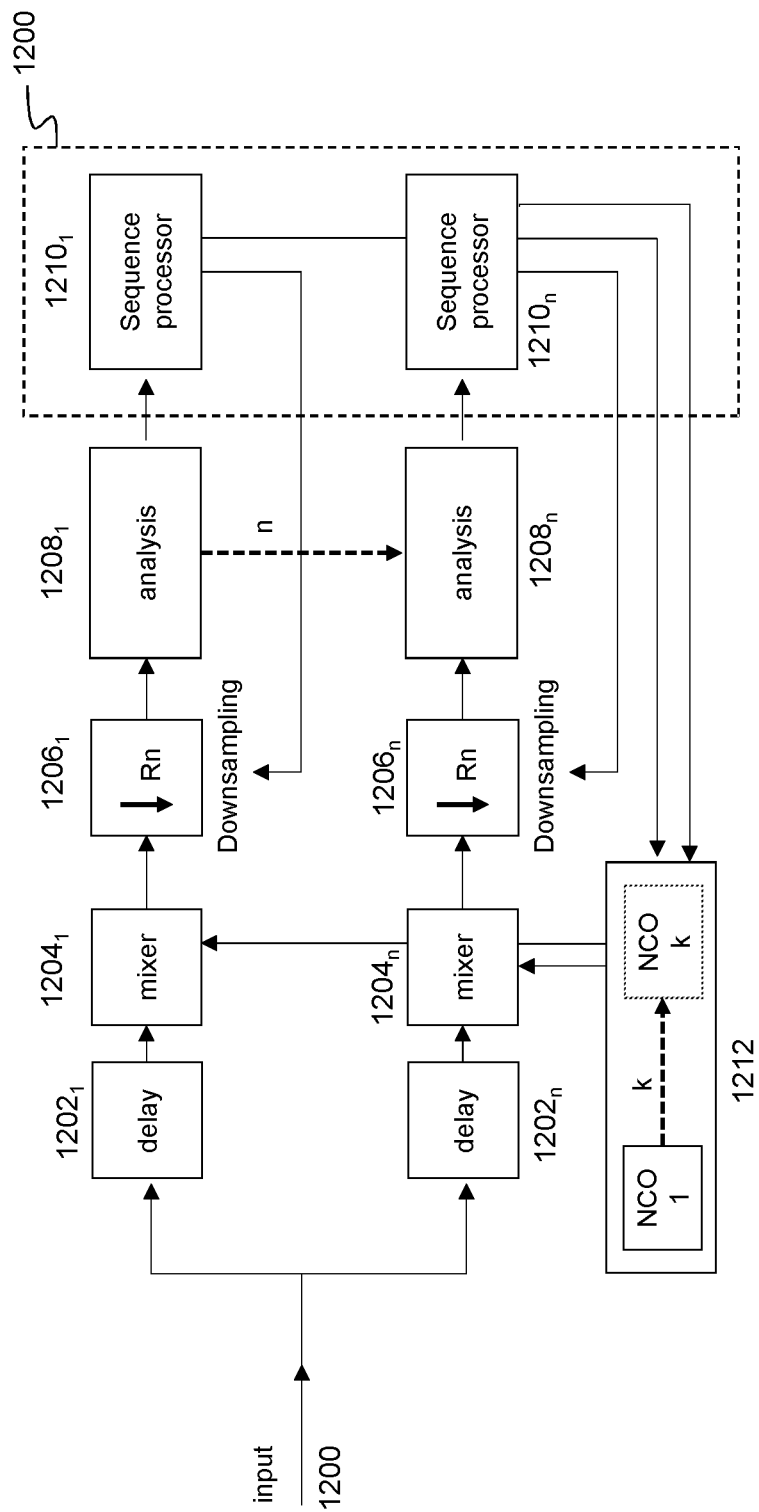
FIG. 12 depicts part of a control system for a quantum device according to an embodiment of the invention.

FIG. 12 illustrates part of a control system for a quantum device according to further embodiment of the invention. This figure depicts a digital signal analyser system that is similar to the one of FIG. 11, including a plurality of digital signal analysers that are configured to process modulated readout signals of different modulation frequencies, wherein each digital signal processor comprises a delay module $1202_{1-n}$, a mixer $1204_{1-n}$ connected to a numerically controlled oscillator, a downsampling module $1206_{1-n}$ and an analysis module $1208_{1-n}$. In this particular example, the NCOs are arranged an oscillator system 1212 comprising multiple NCOs $1214_{1-k}$ that run in parallel (similar to FIG. 9). The NCOS's may be dynamically selected by the sequence processor.

Figure 13:
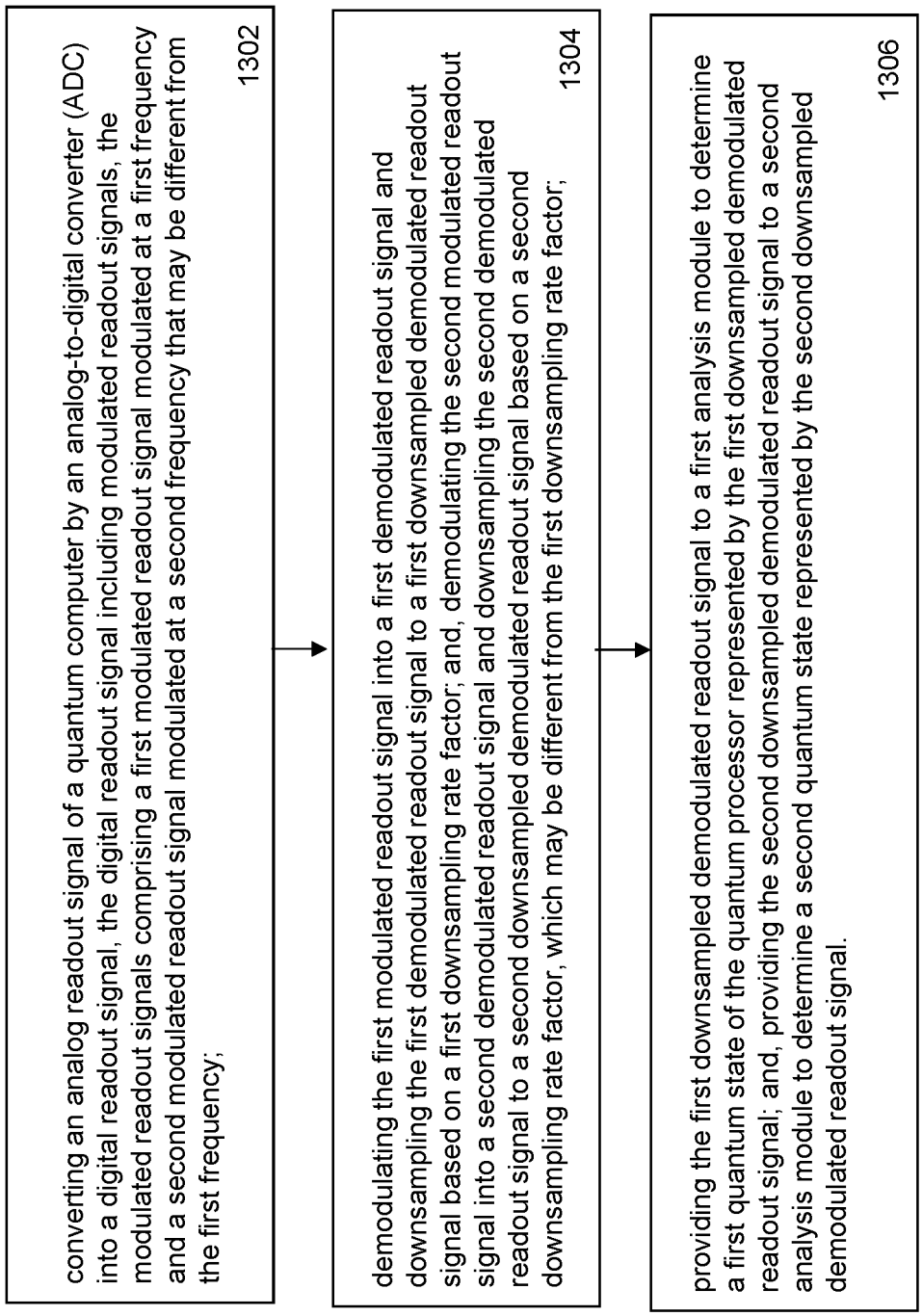
FIG. 13 depicts a process flow for processing a readout signal of a quantum device according to an embodiment of the invention.

FIG. 13 depicts a process flow for processing a readout signal of a quantum device according to an embodiment of the invention. Hence, as shown in FIG. 10-13, the method may include a step of converting an analog readout signal of a quantum computer by an analog-to-digital converter (ADC) into a digital readout signal (step 1302) that is associated with an output downsampling rate. The digital readout signal may include modulated readout signals, wherein the modulated readout signals may comprise a first modulated readout signal modulated at a first frequency and a second modulated readout signal modulated at a second frequency that is different from the first frequency.

Further, the method may include demodulating the first modulated readout signal into a first demodulated readout signal and downsampling the first demodulated readout signal to a first downsampled demodulated readout signal based on a first downsampling rate factor and demodulating the second modulated readout signal into a second demodulated readout signal and downsampling the second demodulated readout signal to a second downsampled demodulated readout signal based on a second downsampling rate factor, which may be different from the first downsampling rate factor (step 1304). The first and second modulated readout signals may be processed in parallel by two different digital signal analysers, each including a mixer and a downsampling module that can be controlled by a sequence processor. Here, the first sequence analyser of the first digital signal processor may configure a first downsampling module according to a first downsampling rate factor while the second digital signal processor may configure a second downsampling module according to a second downsampling rate factor that may be different from the first downsampling rate factor.

Finally, the first downsampled demodulated readout signal may be provided to a first analysis module to determine a first quantum state of the quantum device represented by the first downsampled demodulated readout signal; and, the second downsampled demodulated readout signal to a second analysis module to determine a second quantum state represented by the second downsampled demodulated readout signal. Information on the first and second quantum state may be provided to the sequence processors, which may use this information when executing further instructions of a program for controlling the quantum device.

Figure 14:
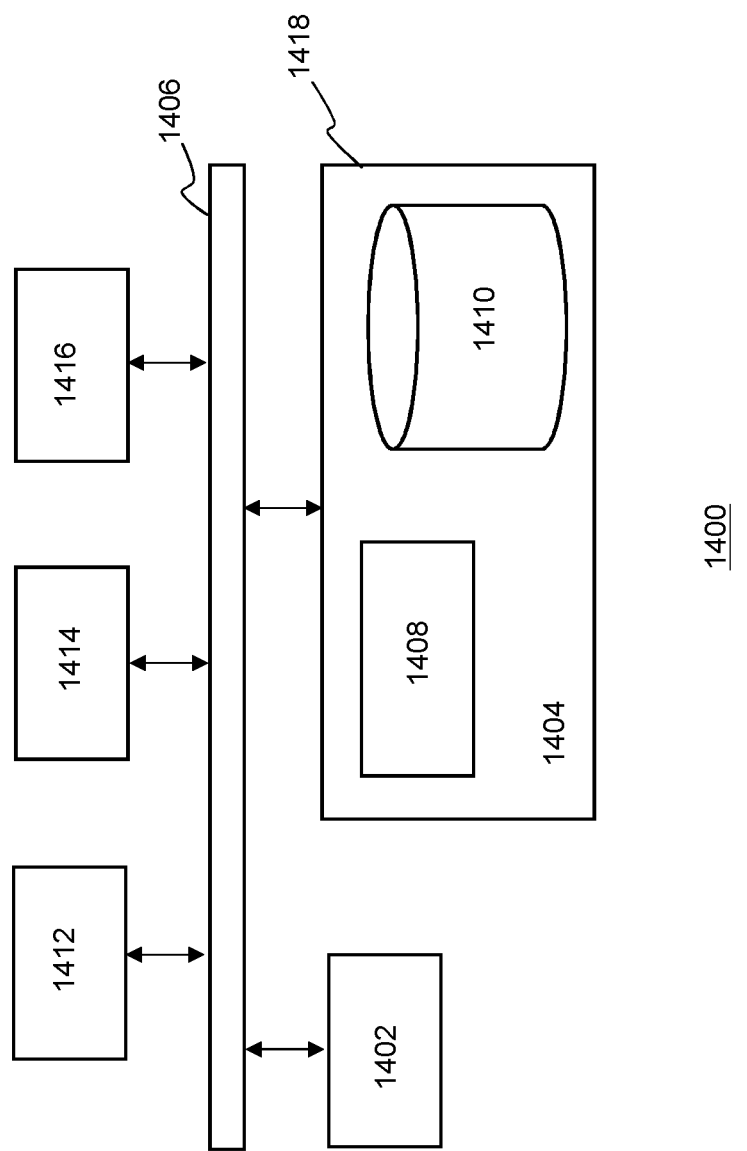
FIG. 14 depicts a block diagram illustrating an exemplary data processing system that may be used with embodiments described in this disclosure.

FIG. 14 is a block diagram illustrating an exemplary data processing apparatus, such as the video processing apparatus and the video player apparatus as described in this disclosure. Data processing apparatus 1400 may include at least one processor 1402 coupled to memory elements 1404 through a system bus 1406. As such, the data processing apparatus may store program code within memory elements 1404. Further, processor 1402 may execute the program code accessed from memory elements 1404 via system bus 1406. In one aspect, data processing apparatus may be implemented as a computer that is suitable for storing and/or executing program code. It should be appreciated, however, that data processing apparatus 1400 may be implemented in the form of any system including a processor and memory that is capable of performing the functions described within this specification.

Memory elements 1404 may include one or more physical memory devices such as, for example, local memory 1408 and one or more bulk storage devices 1410. Local memory may refer to random access memory or other non-persistent memory device(s) generally used during actual execution of the program code. A bulk storage device may be implemented as a hard drive or other persistent data storage device. The data processing apparatus x00 may also include one or more cache memories (not shown) that provide temporary storage of at least some program code in order to reduce the number of times program code must be retrieved from bulk storage device 1410 during execution.

Input/output (I/O) devices depicted as input device 1412 and output device 1414 optionally can be coupled to the data processing system. Examples of input device may include, but are not limited to, for example, a keyboard, a pointing device such as a mouse, or the like. Examples of output device may include, but are not limited to, for example, a monitor or display, speakers, or the like. Input device and/or output device may be coupled to data processing system either directly or through intervening I/O controllers. A network adapter 1416 may also be coupled to data processing system to enable it to become coupled to other systems, computer systems, remote network devices, and/or remote storage devices through intervening private or public networks. The network adapter may comprise a data receiver for receiving data that is transmitted by said systems, devices and/or networks to said data and a data transmitter for transmitting data to said systems, devices and/or networks. Modems, cable modems, and Ethernet cards are examples of different types of network adapter that may be used with data processing system 1400.

As pictured in FIG. 14, memory elements 1404 may store an application 1418. It should be appreciated that data processing apparatus 1400 may further execute an operating system (not shown) that can facilitate execution of the application. Application, being implemented in the form of executable program code, can be executed by data processing system 1400, e.g., by processor 1402. Responsive to executing application, data processing system may be configured to perform one or more operations to be described herein in further detail.

In one aspect, for example, data processing apparatus 1400 may represent a client data processing apparatus. In that case, application 1418 may represent a client application that, when executed, configures data processing system 1400 to perform the various functions described herein with reference to a "client device".

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

This disclosure may generally refer to video encoder "signaling" certain information to another device, such as video decoder. The term "signaling" may generally refer to the communication of syntax elements and/or other data (metadata) used to decode the compressed video data. Such communication may occur in real- or near-real-time. Alternately, such communication may occur over a span of time, such as might occur when storing syntax elements to a computer-readable storage medium in an encoded bitstream at the time of encoding, which then may be retrieved by a decoding device at any time after being stored to this medium.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of controlling a quantum device comprising:
    executing, by a first digital circuit-based sequence processor and a second digital circuit-based sequence processor, operations of a control program, the first and second sequence processors being associated with one or more memory modules comprising stored data representing a plurality of digital pulse signals, the executing of the operations of the control program comprising:
    selecting by the first and second sequence processors a first and a second digital pulse signal, respectively, from the plurality of digital pulse signals, the first digital pulse signal being associated with a first upsampling rate and the second digital pulse signal being associated with a second upsampling rate, which is different from the first upsampling rate;
    retrieving by a first pulse sequence generator controlled by the first sequence processor, first data representing the first digital pulse signal at a first sample rate from the one or more memory modules, upsampling, by a first upsampling module of the first pulse sequence generator, the first digital pulse signal based on the first upsampling rate, modulating the first digital pulse signal using a first modulation signal having a first modulation frequency, the first modulation signal being generated by a first oscillator controlled by the first sequence processor, and providing data representing a first modulated upsampled digital pulse signal at a sampling rate of a digital to analog convertor to a summer;
    retrieving, by a second pulse sequence generator controlled by the second sequence processor, second data representing the second digital pulse signal at a second sample rate from the one or more memory modules, upsampling by a second upsampling module of the second pulse sequence generator the second digital pulse signal based on the second upsampling rate, modulating the second digital pulse signal using a second modulation signal having a second modulation frequency, which is different from the first modulation frequency, the second modulation signal being generated by a second oscillator controlled by the second sequence processor, and providing data representing a second upsampled digital pulse signal at the sampling rate of the digital to analog converter to the summer;
    generating, by the summer, a digital pulse sequence signal based on the first and second modulated upsampled digital pulse signals; and,
    converting the digital pulse sequence signal, by the digital to analog converter, into an analog pulse sequence signal, a sequence of pulses of the analog pulse sequence signal representing one or more operations on quantum elements of the quantum device.

2. The method according to claim 1, wherein the executing of the operations of the control program further comprises:
    applying a first interpolation filter to the first modulated upsampled digital pulse signal; and/or, applying a second interpolation filter to the second modulated upsampled digital pulse signal.

3. The method according to claim 1, wherein the executing of the operations of the control program further comprises:
    providing upsampling information for upsampling the first and second digital pulse signals.

4. The method according to claim 1, wherein upsampling information for upsampling the first and second digital pulse signals is stored in the one or more memory modules and wherein the generating of the digital pulse sequence signals further comprises:
    retrieving the upsampling information from the one or more memory modules.

5. The method according to claim 4, wherein the first sequence processor is configured to provide a first upsampling module of the first pulse sequence generator with upsampling information for upsampling the first digital pulse signal; and/or, the second sequence processor is configured to provide a second upsampling module of the first pulse sequence generator with upsampling information for upsampling the second digital pulse signal.

6. The method according to claim 1, wherein the one or more memory modules is one or more block random access memory modules.

7. The method according to claim 3, wherein the upsampling information includes information about the first upsampling rate for upsampling the first digital pulse signal and the second upsampling rate for upsampling the second digital pulse signal.

8. The method according to claim 1, wherein the first and second modulation frequency is generated by one or more numerically controlled oscillators.

9. A system for controlling a quantum device comprising:
    at least a first electronic circuit-based sequence processor and a second electronic circuit-based sequence processor, the first and second sequence processors being associated with one or more memory modules comprising stored data representing a plurality of digital pulse signals, the first and second sequence processors being configured to execute operations of a program for controlling the quantum device;
    at least a first pulse sequence generator and a second pulse sequence generator controlled by the first sequence processor and second sequence processor, respectively;
    a summer configured to generate a digital pulse sequence signal based on digital pulse signals generated by the first pulse sequence generator and the second pulse sequence generator; and, a digital-to-analog converter associated with a digital-to-analog converter sampling rate for converting the digital pulse sequence signal into an analog pulse sequence signal, a sequence of pulses of the analog pulse sequence signal representing one or more operations on quantum elements of the quantum device;

the first sequence processor being adapted to select a first digital pulse signal associated with a first upsampling rate from the plurality of digital pulse signals stored in the one or more memory modules;

the second sequence processor being adapted to select a second digital pulse signal associated with a second upsampling rate from the plurality of digital pulse signals stored in the one or more memory modules;

the first pulse sequence generator comprising a first upsampling module configured to retrieve first data representing the first digital pulse signal from the one or more memory modules, and to upsample the first digital pulse signal based on the first upsampling rate, a first signal modulator configured to modulate the first digital pulse signal using a first modulation signal having a first modulation frequency, the first modulation signal being generated by a first oscillator controlled by the first sequence processor, and configured to provide data representing a first modulated upsampled digital pulse signal at the digital-to-analog converter sampling rate to the summer;

the second pulse sequence generator comprising a second upsampling module configured to retrieve second data representing the second digital pulse signal from the one or more memory modules, and to upsample the second digital pulse signal based on the second upsampliing rate which is different from the first upsampling rate, a second signal modulator configured to modulate the second digital pulse signal using a second modulation signal having a second modulation frequency, which is different from the first modulation frequency, the second modulation signal being generated by a second oscillator controlled by the second sequence processor, and configured to provide data representing a second modulated upsampled digital pulse signal at the digital-to-analog converter sampling rate to the summer.

10. The system according to claim 9, wherein the first upsampling module is further configured to apply a first interpolation filter to the first modulated upsampled digital pulse signal; and/or, the second upsampling module is further configured apply a second interpolation filter to the second modulated upsampled digital pulse signal.

11. The system according to claim 9, wherein
the first sequence processor is further configured to provide upsampling information to the first upsampling module for upsampling the first digital pulse signal; and/or,
the second sequence processor is further configured to provide upsampling information to the second upsampling module for upsampling the second digital pulse signal.

12. The system according to claim 9, wherein upsampling information for upsampling the first and second digital pulse signals is stored in the one or more memory modules and the first and second sequence processors are further configured to retrieve at least part of the upsampling information from the one or more memory modules.

13. The system according to claim 9, wherein the first and second sequence processors, the one or more memory modules, the first and second pulse sequence generators, the summer, and, optionally, the digital-to-analog converter, are implemented as one or more digital circuits.

14. The system according to claim 9, wherein the one or more memory modules is one or more block random access memory modules.

15. The system according to claim 9, wherein the first and second modulation frequency is generated by one or more numerically controlled oscillators.

16. A non-transient computer-readable storage medium having stored thereon a computer program product comprising software code portions configured for, when run in the memory of a computer, executing the method steps according to claim 1.

\* \* \* \* \*